United States Patent
Hisamoto

(10) Patent No.: US 10,147,488 B2
(45) Date of Patent: Dec. 4, 2018

(54) SEMICONDUCTOR DEVICE

(71) Applicant: Renesas Electronics Corporation, Koutou-ku, Tokyo (JP)

(72) Inventor: Digh Hisamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/640,568

(22) Filed: Jul. 2, 2017

(65) Prior Publication Data

US 2018/0082745 A1   Mar. 22, 2018

(30) Foreign Application Priority Data

Sep. 21, 2016   (JP) .................................. 2016-183663

(51) Int. Cl.
| | | |
|---|---|---|
| *H01L 27/115* | (2017.01) | |
| *G11C 16/10* | (2006.01) | |
| *G11C 16/24* | (2006.01) | |
| *G11C 16/30* | (2006.01) | |
| *G11C 8/08* | (2006.01) | |

(Continued)

(52) U.S. Cl.
CPC .............. *G11C 16/10* (2013.01); *G11C 8/08* (2013.01); *G11C 16/0425* (2013.01); *G11C 16/08* (2013.01); *G11C 16/14* (2013.01); *G11C 16/16* (2013.01); *G11C 16/24* (2013.01); *G11C 16/26* (2013.01); *G11C 16/30* (2013.01);
(Continued)

(58) Field of Classification Search
CPC ........................ H01L 27/115; G11C 16/0425
USPC .................................................. 365/185.14
See application file for complete search history.

(56) References Cited

U.S. PATENT DOCUMENTS

| | | | |
|---|---|---|---|
| 7,212,444 B2 | 5/2007 | Hisamoto et al. | |
| 7,688,290 B2 * | 3/2010 | Yamazaki | ................ G09G 3/30 |
| | | | 315/169.3 |

(Continued)

FOREIGN PATENT DOCUMENTS

JP   4664707 B2   4/2011

OTHER PUBLICATIONS

D. Hisamoto, et al., "FinFET—A Self-aligned Double-gate MOSFET Scalable to 20nm," IEEE Trans. Electron Devices, vol. 47, No. 12, pp. 2320-2325 (2000).

*Primary Examiner* — Hoai V Ho
*Assistant Examiner* — Minh Dinh
(74) *Attorney, Agent, or Firm* — Shapiro, Gabor and Rosenberger, PLLC

(57) ABSTRACT

Provided is a semiconductor device including nonvolatile memory cells each including a FinFET having excellent memory characteristics. The semiconductor device includes a semiconductor substrate, memory cells each formed in the semiconductor substrate and having a split-gate structure including an opposed-gate selection gate electrode, a memory gate electrode, and a pair of terminals, and a word line driver circuit which supplies a selection voltage to a selection gate electrode of the selected one of the memory cells and supplies a non-selection voltage to the selection gate electrode of the non-selected one of the memory cells. The word line driver circuit supplies, as the non-selection voltage, a voltage which is negative or positive relative to a potential in the semiconductor substrate so as to bring a selection transistor corresponding to the selection gate electrode of the non-selected memory cell into an OFF state.

13 Claims, 23 Drawing Sheets

(51) Int. Cl.
 *G11C 16/04* (2006.01)
 *G11C 16/08* (2006.01)
 *G11C 16/14* (2006.01)
 *G11C 16/16* (2006.01)
 *G11C 16/26* (2006.01)
 *G11C 16/32* (2006.01)
 *G11C 16/34* (2006.01)
 *H01L 29/78* (2006.01)

(52) U.S. Cl.
 CPC .......... *G11C 16/32* (2013.01); *G11C 16/3418* (2013.01); *H01L 29/785* (2013.01)

(56) References Cited

U.S. PATENT DOCUMENTS

| | | | |
|---|---|---|---|
| 8,885,403 B2* | 11/2014 | Hong | G11C 11/40 365/182 |
| 9,722,096 B2* | 8/2017 | Kawashima | H01L 29/7923 |
| 9,899,402 B2* | 2/2018 | Tseng | H01L 27/11568 |
| 2012/0195127 A1* | 8/2012 | Nakatake | G11C 16/24 365/185.23 |

\* cited by examiner

FIG. 4A

| SELECTED MEMORY CELL MC(11) | VBL | VWL | VMG | VSL | VB |
|---|---|---|---|---|---|
| ERASE | Vs | Vvgnd+Vcge | Vmge | Vse | Vs |
| WRITE | Vs/Vc | Vvgnd+Vcgp | Vmgp | Vsp | Vs |
| READ | Vc | Vvgnd+Vc | Vs | Vs | Vs |

FIG. 4B

| NON-SELECTED MEMORY CELL MC(10) SHARING WORD LINE | VBL | VWL | VMG | VSL | VB |
|---|---|---|---|---|---|
| ERASE | Vs | Vvgnd+Vcge | Vmge | Vse | Vs |
| WRITE | Vc | Vvgnd+Vcgp | Vmgp | Vsp | Vs |
| READ | Vs | Vvgnd+Vc | Vs | Vs | Vs |

FIG. 4C

| NON-SELECTED MEMORY CELL MC(01) SHARING BIT LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vs | Vs |
| READ | Vc | Vvgnd | Vs | Vs | Vs |

FIG. 4D

| NON-SELECTED MEMORY CELL MC(21) SHARING SOURCE LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vsp | Vs |
| READ | Vc | Vvgnd | Vs | Vs | Vs |

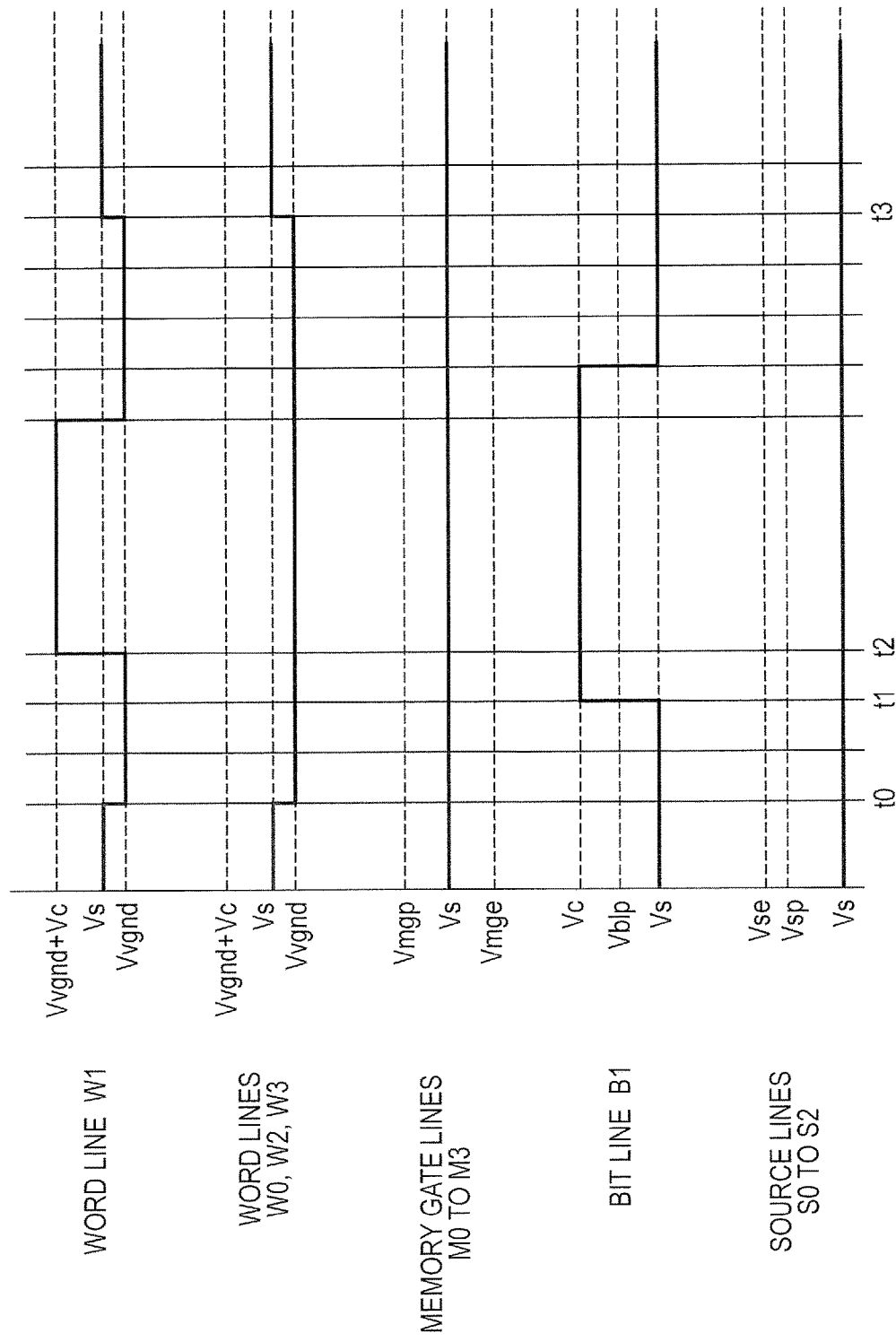

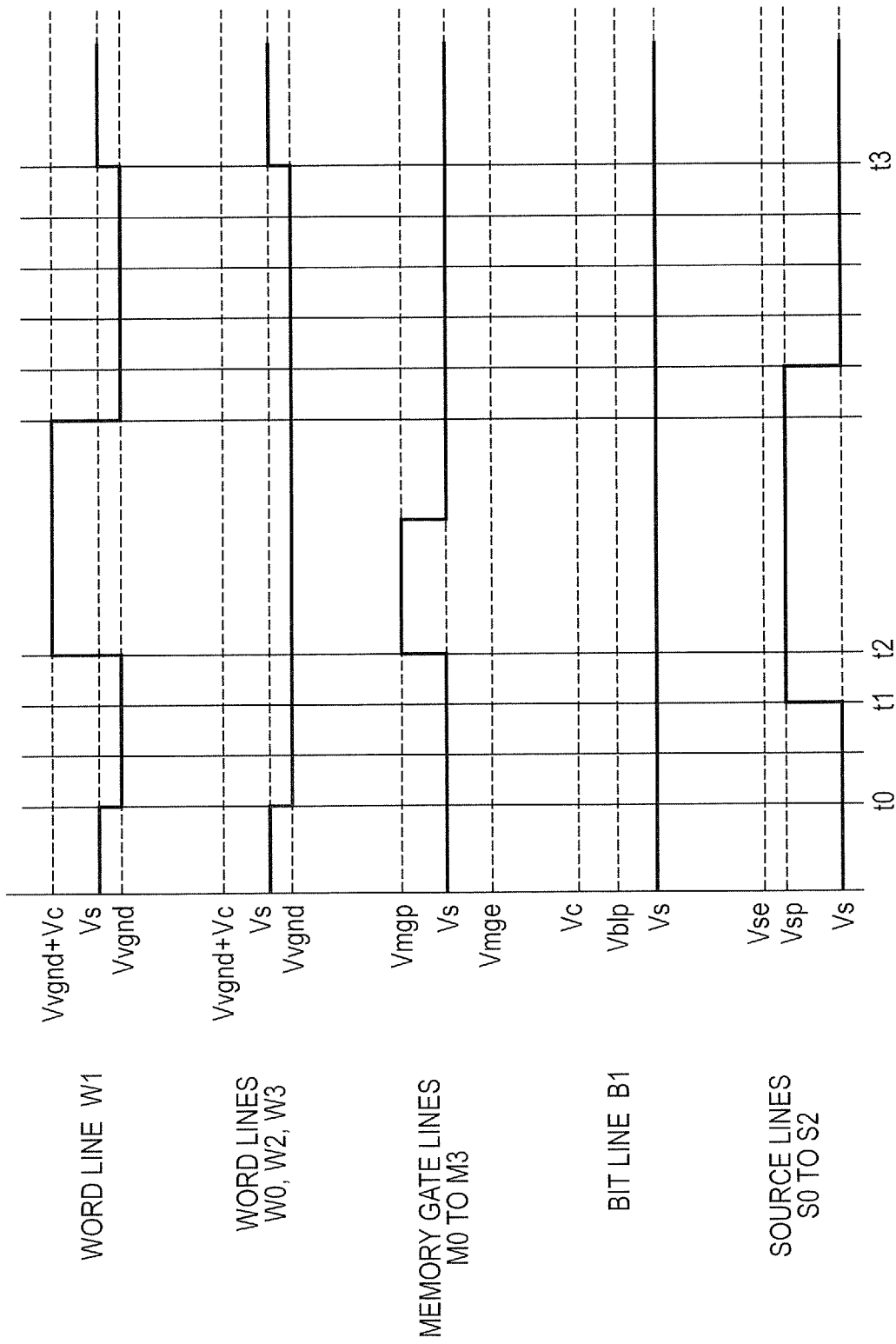

FIG. 8A

| SELECTED MEMORY CELL MC(11) | VBL | VWL | VMG | VSL | VB |
|---|---|---|---|---|---|
| ERASE | Vs | Vvgnd+ Vcge | Vmge | Vse | Vs |
| WRITE | Vs/Vc | Vvgnd+ Vcgp | Vmgp | Vsp | Vs |
| READ | Vc | Vvgnd+ Vc | Vs | Vs | Vs |

FIG. 8B

| SELECTED MEMORY CELL MC(10) SHARING WORD LINE | VBL | VWL | VMG | VSL | VB |
|---|---|---|---|---|---|
| ERASE | Vs | Vvgnd+ Vcge | Vmge | Vse | Vs |
| WRITE | Vs/Vc | Vvgnd+ Vcgp | Vmgp | Vsp | Vs |
| READ | Vc | Vvgnd+ Vc | Vs | Vs | Vs |

FIG. 8C

| NON-SELECTED MEMORY CELL MC(01) SHARING BIT LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vs | Vs |
| READ | Vc | Vvgnd | Vs | Vs | Vs |

FIG. 8D

| NON-SELECTED MEMORY CELL MC(21) SHARING SOURCE LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vsp | Vs |
| READ | Vc | Vvgnd | Vs | Vs | Vs |

FIG. 10A

| SELECTED MEMORY CELL MC(11) | VBL | VWL | VMG | VSL | VB |
|---|---|---|---|---|---|
| ERASE | Vs | Vvgnd+Vcge | Vmge | Vse | Vs |
| WRITE | Vs/Vc | Vvgnd+Vcgp | Vmgp | Vsp | Vs |
| READ | Vc | Vvgnd+Vc | Vs | Vs | Vs |

FIG. 10B

| NON-SELECTED MEMORY CELL MC(10) SHARING WORD LINE | VBL | VWL | VMG | VSL | VB |
|---|---|---|---|---|---|
| ERASE | Vs | Vvgnd+Vcge | Vmge | Vse | Vs |
| WRITE | Vc | Vvgnd+Vcgp | Vmgp | Vsp | Vs |
| READ | Vs | Vvgnd+Vc | Vs | Vs | Vs |

FIG. 10C

| NON-SELECTED MEMORY CELL MC(01) SHARING BIT LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vsp | Vs |
| READ | Vc | Vvgnd | Vs | Vs | Vs |

FIG. 10D

| NON-SELECTED MEMORY CELL MC(21) SHARING SOURCE LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vsp | Vs |
| READ | Vc | Vvgnd | Vs | Vs | Vs |

FIG. 11A

| SELECTED MEMORY CELL MC(11) | VBL | VWL | VMG | VSL | VB |
|---|---|---|---|---|---|
| ERASE | Vs | Vvgnd+Vcge | Vmge | Vse | Vs |
| WRITE | Vs/Vc | Vvgnd+Vcgp | Vmgp | Vsp | Vs |
| READ | Vc | Vvgnd+Vc | Vs | Vs | Vs |

FIG. 11B

| SELECTED MEMORY CELL MC(10) SHARING WORD LINE | VBL | VWL | VMG | VSL | VB |
|---|---|---|---|---|---|
| ERASE | Vs | Vvgnd+Vcge | Vmge | Vse | Vs |
| WRITE | Vs/Vc | Vvgnd+Vcgp | Vmgp | Vsp | Vs |
| READ | Vc | Vvgnd+Vc | Vs | Vs | Vs |

FIG. 11C

| NON-SELECTED MEMORY CELL MC(01) SHARING BIT LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vsp | Vs |
| READ | Vc | Vvgnd | Vs | Vs | Vs |

FIG. 11D

| NON-SELECTED MEMORY CELL MC(21) SHARING SOURCE LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vsp | Vs |
| READ | Vc | Vvgnd | Vs | Vs | Vs |

*FIG. 13A*

| SELECTED MEMORY CELL MC(11) | VBL | VWL | VMG | VSL | VB |
|---|---|---|---|---|---|
| ERASE | Vs | Vcge | Vmge | Vse | Vs |
| WRITE | Vs/Vc | Vcgp | Vmgp | Vsp | Vs |
| READ | Vc | Vc | Vs | Vs | Vs |

*FIG. 13B*

| NON-SELECTED MEMORY CELL MC(10) SHARING WORD LINE | VBL | VWL | VMG | VSL | VB |
|---|---|---|---|---|---|
| ERASE | Vs | Vcge | Vmge | Vse | Vs |
| WRITE | Vc | Vcgp | Vmgp | Vsp | Vs |
| READ | Vs | Vc | Vs | Vs | Vs |

*FIG. 13C*

| NON-SELECTED MEMORY CELL MC(01) SHARING BIT LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vs | Vs |
| READ | Vc | Vvgnd | Vs | Vs | Vs |

*FIG. 13D*

| NON-SELECTED MEMORY CELL MC(21) SHARING SOURCE LINE | VBL | VWL | VMG | VSL | VB |
|---|---|---|---|---|---|
| ERASE | Vs | Vvgnd | Vmge | Vse | Vs |
| WRITE | Vs/Vc | Vvgnd | Vmgp | Vsp | Vs |
| READ | Vc | Vvgnd | Vs | Vs | Vs |

FIG. 14A

| SELECTED MEMORY CELL MC(11) | VBL | VWL | VMG | VSL | VB |
|---|---|---|---|---|---|
| ERASE | Vs | Vvgnd+Vcge | Vmge | Vse | Vs |
| WRITE | Vblp/Vc | Vvgnd+Vcgp | Vmgp | Vsp | Vs |
| READ | Vc | Vvgnd+Vc | Vs | Vs | Vs |

FIG. 14B

| NON-SELECTED MEMORY CELL MC(10) SHARING WORD LINE | VBL | VWL | VMG | VSL | VB |
|---|---|---|---|---|---|
| ERASE | Vs | Vvgnd+Vcge | Vmge | Vse | Vs |
| WRITE | Vc | Vvgnd+Vcgp | Vmgp | Vsp | Vs |
| READ | Vs | Vvgnd+Vc | Vs | Vs | Vs |

FIG. 14C

| NON-SELECTED MEMORY CELL MC(01) SHARING BIT LINE | VBL | VWL | VMG | VSL | VB |
|---|---|---|---|---|---|
| ERASE | Vs | Vvgnd | Vmge | Vse | Vs |
| WRITE | Vblp/Vc | Vvgnd | Vmgp | Vsp | Vs |
| READ | Vc | Vvgnd | Vs | Vs | Vs |

FIG. 14D

| NON-SELECTED MEMORY CELL MC(21) SHARING SOURCE LINE | VBL | VWL | VMG | VSL | VB |
|---|---|---|---|---|---|
| ERASE | Vs | Vvgnd | Vmge | Vse | Vs |
| WRITE | Vblp/Vc | Vvgnd | Vmgp | Vsp | Vs |
| READ | Vc | Vvgnd | Vs | Vs | Vs |

FIG. 19A

| OPERATION | VBL | VWL | VMG | VSL | VB |
|---|---|---|---|---|---|
| ERASE | Vs | Vcge | Vmge | Vse | Vs |
| WRITE | Vs/Vc | Vcgp | Vmgp | Vsp | Vs |
| READ | Vc | Vc | Vs | Vs | Vs |

FIG. 19B

| OPERATION | VBL | VWL | VMG | VSL | VB |
|---|---|---|---|---|---|
| ERASE | 0 | 0 | -5 | 5 | 0 |
| WRITE | 0/1.5 | 0.5 | 10 | 5 | 0 |
| READ | 1.5 | 1.5 | 0 | 0 | 0 |

FIG. 20A

| SELECTED MEMORY CELL MC(11) | VBL | VWL | VMG | VSL | VB |
|---|---|---|---|---|---|
| ERASE | Vs | Vcge | Vmge | Vse | Vs |
| WRITE | Vs/Vc | Vcgp | Vmgp | Vsp | Vs |
| READ | Vc | Vc | Vs | Vs | Vs |

FIG. 20B

| NON-SELECTED MEMORY CELL MC(10) SHARING WORD LINE | VBL | VWL | VMG | VSL | VB |
|---|---|---|---|---|---|
| ERASE | Vs | Vcge | Vmge | Vse | Vs |
| WRITE | Vc | Vcgp | Vmgp | Vsp | Vs |
| READ | Vs | Vc | Vs | Vs | Vs |

FIG. 20C

| NON-SELECTED MEMORY CELL MC(01) SHARING BIT LINE | VBL | VWL | VMG | VSL | VB |
|---|---|---|---|---|---|
| ERASE | Vs | Vs | Vmge | Vse | Vs |
| WRITE | Vs/Vc | Vs | Vmgp | Vs | Vs |
| READ | Vc | Vs | Vs | Vs | Vs |

FIG. 20D

| NON-SELECTED MEMORY CELL MC(21) SHARING SOURCE LINE | VBL | VWL | VMG | VSL | VB |
|---|---|---|---|---|---|
| ERASE | Vs | Vs | Vmge | Vse | Vs |
| WRITE | Vs/Vc | Vs | Vmgp | Vsp | Vs |
| READ | Vc | Vs | Vs | Vs | Vs |

SEMICONDUCTOR DEVICE

CROSS-REFERENCE TO RELATED APPLICATIONS

The disclosure of Japanese Patent Application No. 2016-183663 filed on Sep. 21, 2016 including the specification, drawings and abstract is incorporated herein by reference in its entirety.

BACKGROUND

The present invention relates to a semiconductor device, and particularly to a semiconductor device including an electrically rewritable nonvolatile memory cell having a split-gate structure using a FinFET (Field Effect Transistor).

As the miniaturization of semiconductor devices proceeds, the structure of an element such as a field effect transistor (FET) evolves. To obtain a stable switching operation, an insulated-gate FET having a three-dimensional structure using a fin-type channel referred to as a FinFET has been used as a standard element structure forming a semiconductor device. The FinFET has an opposed-gate gate electrode structure having at least a pair of gate electrodes which are disposed to be opposed to each other such that a semiconductor region (fin region) where a channel is formed is interposed therebetween and to which voltages or signals are supplied in synchronization. Such a FinFET is described in, e.g., Non-Patent Document 1.

As an example of a semiconductor device including electrically rewritable nonvolatile memory cells, a microcomputer in which a flash memory is mounted is known. The semiconductor device including the electrically rewritable nonvolatile memory cells is described in, e.g., Patent Document 1.

RELATED ART DOCUMENTS

Patent Document

[Patent Document 1] Japanese Patent No. 4664707

Non-Patent Document

[Non-Patent Document 1] D. Hisamoto, et al., "FinFET-A Self-aligned Double-gate MOSFET Scalable to 20 nm" IEEE Trans. Electron Devices, Vol. 47, no. 12, pp. 2320-2325, 2000.

SUMMARY

As an electrically rewritable non-volatile memory cell, a nonvolatile memory cell having a split-gate structure using a silicon nitride film interposed between silicon insulating films as a charge storage layer (charge retention layer) is known. The nonvolatile memory cell having the split-gate structure includes a selection gate electrode, a memory gate electrode, and a pair of semiconductor regions (terminals). In the nonvolatile memory having the split-gate structure, the pair of semiconductor regions described above function as a drain region and a source region, and a gate electrode disposed between the drain region and the source region is split into the selection gate electrode and the memory gate electrode. Accordingly, the nonvolatile memory cell having the split-gate structure can be regarded to have a configuration in which a selection FET (hereinafter referred to also as a selection transistor) corresponding to the selection gate electrode and a memory FET (hereinafter referred to also as a memory transistor) corresponding to the memory gate electrode are coupled in series to each other.

In this case, in the memory transistor, the silicon insulating film, the silicon nitride film, and the silicon insulating film each described above are stacked between a semiconductor region where a channel is formed and the memory gate electrode. That is, the memory transistor serves as a MONOS (Metal Oxide Nitride Oxide Silicon) transistor. Since a MONOS film, i.e., the silicon nitride film has a stable charge retention property, highly reliable memory characteristics can be obtained. By providing the split-gate structures, in write/erase operations, hot carrier injection which allows for higher-speed operations can be used. In addition, since the selection gate electrode and the memory gate electrode are separate from each other, a higher-speed read operation can be performed.

On the other hand, by operating the FinFET in a state where the channel thereof is completely depleted, an excellent switching characteristic can be obtained to allow a stable switching operation to be performed. Accordingly, it is considered that the FinFET is used as a standard FET in semiconductor devices with design rules beyond 20 nm. Therefore, the present inventors have considered the use of a FinFET even in a nonvolatile memory having a split-gate structure. In this case, the FinFET is characterized in that, since the FinFET is operated in the state where the channel thereof is completely depleted, even when an impurity is introduced into the semiconductor region where the channel is formed, it is difficult to control the threshold voltage of the FinFET.

When the data written in a nonvolatile memory cell is read, a voltage (or current) in accordance with the threshold voltage of the nonvolatile memory cell is detected. Accordingly, the data retention property of the nonvolatile memory cell varies depending on the set threshold voltage. When a nonvolatile memory cell having a split-gate structure is formed using a FinFET, it is difficult to control the threshold voltage thereof by introducing an impurity. This leads to a concern that the data retention property is affected to degrade the memory characteristics.

Neither Patent Document 1 nor Non-Patent Document 1 describes the formation of a non-volatile memory cell having a split-gate structure using a FinFET.

Other problems and novel features of the present invention will become apparent from a statement in the present specification and the accompanying drawings.

A semiconductor device according to an embodiment includes a first semiconductor region, a plurality of nonvolatile memory cells formed in the first semiconductor region, and a first driver circuit. Each of the nonvolatile memory cells mentioned herein includes an opposed-gate selection gate electrode, a memory gate electrode, and a pair of terminals. The first driver circuit supplies a selection voltage to the selection gate electrode of the selected one of the nonvolatile memory cells and supplies a non-selection voltage to the selection gate electrode of the non-selected nonvolatile memory cell. The first driver circuit supplies, as the non-selection voltage, a voltage which is negative or positive relative to a potential in the first semiconductor region so as to bring a selection transistor corresponding to the selection gate electrode of the non-selected nonvolatile memory cell into an OFF state.

According to the embodiment, it is possible to provide the semiconductor device including the nonvolatile memory cells each including a FinFET having excellent memory characteristics.

BRIEF DESCRIPTION OF THE DRAWINGS

FIGS. 4A to 4D are views showing bias voltages for a nonvolatile memory module according to Embodiment 1;

FIG. 5 is a waveform chart showing a read operation according to Embodiment 1;

FIG. 7 is a waveform chart showing a write operation according to Embodiment 1;

FIGS. 8A to 8D are views each showing bias voltages for a nonvolatile memory module according to Modification 1 of Embodiment 1;

FIGS. 10A to 10D are views showing bias voltages for the nonvolatile memory module according to Modification 2 of Embodiment 1;

FIGS. 11A to 11D are views showing bias voltages for a nonvolatile memory module according to Modification 3 of Embodiment 1;

FIGS. 13A to 13D are views showing bias voltages for a nonvolatile memory module according to Embodiment 2;

FIGS. 14A to 14D are views showing bias voltages for a nonvolatile memory module according to Embodiment 3;

FIGS. 19A and 19B are views each showing bias voltages for each of the memory cells;

FIGS. 20A to 20D are views showing bias voltages for the memory cells;

DETAILED DESCRIPTION

Figure 1:
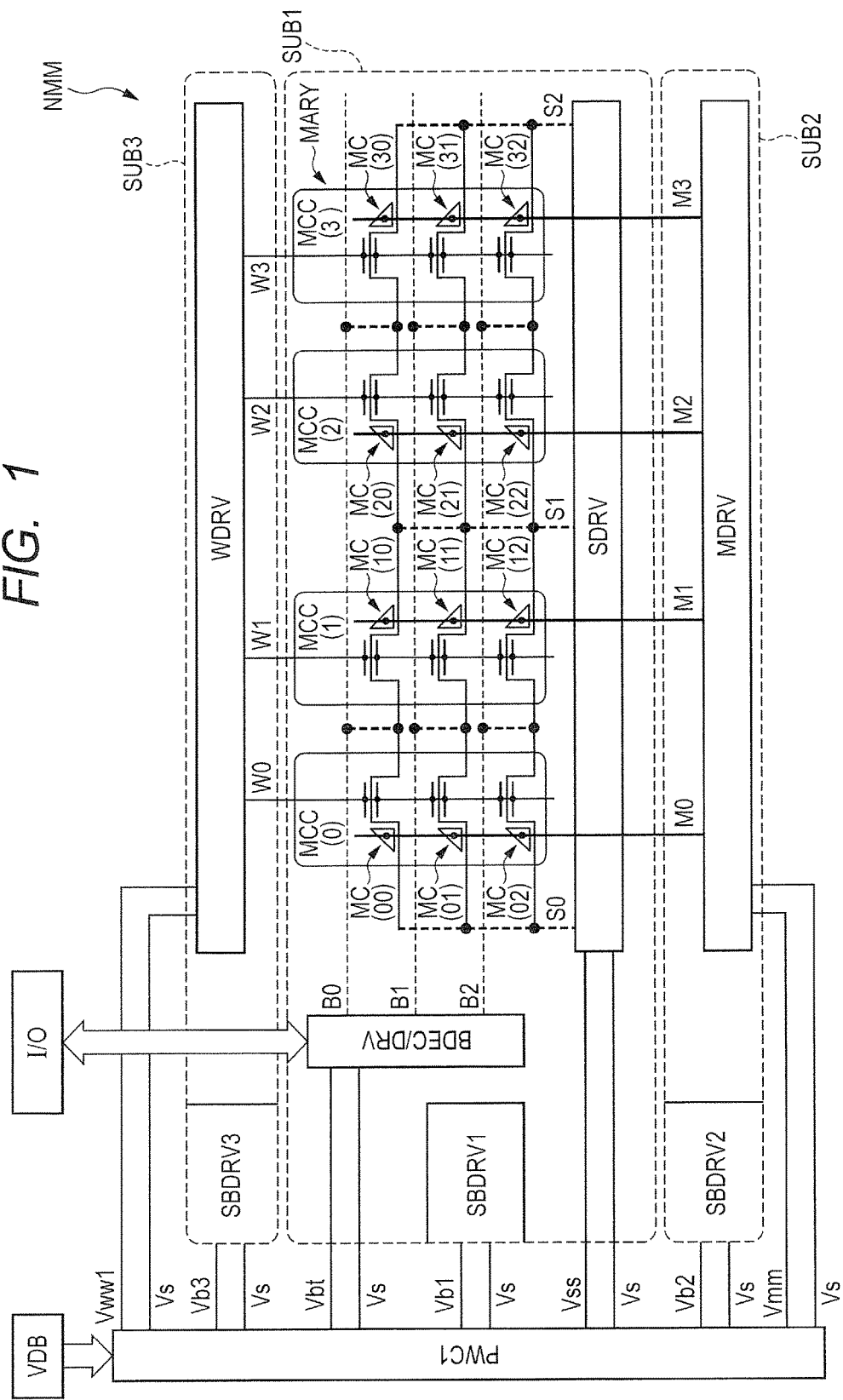
FIG. 1 is a block diagram showing a configuration of a semiconductor device according to Embodiment 1.

The following will describe the embodiments of the present invention in detail on the basis of the drawings. Note that, throughout all the drawings for illustrating the embodiments, like parts are designated by like reference numerals, and a repeated description thereof is omitted in principle.

Embodiment 1

Examples of an insulated-gate FET included in a semiconductor device include not only the FinFET described above, but also a so-called planar insulated-gate FET (hereinafter referred to also as a planar FET). The planar FET includes a source region and a drain region which are formed in a semiconductor substrate and a gate electrode disposed over the region of the semiconductor substrate where a channel is formed via a gate insulating film. A technique (substrate bias application technique) has been known in which, in the semiconductor device including the planar FET, a substrate bias voltage is applied to a semiconductor substrate to adjust the threshold voltage of the planar FET. The present inventors have been inspired by the substrate bias application technique and have considered providing a semiconductor device including nonvolatile memory cells having excellent memory characteristics, while taking advantage of the characteristics of the FinFET.

<Planar FET and FinFET>

For easier understanding of Embodiment 1, a description will be given first of a planar FET and a FinFET. In the description given herein, an N-channel planar FET and an n-channel FinFET are used by way of example. However, the same also applies also to a P-channel planar FET and a P-channel FinFET. Note that, in the following description, the N-channel FinFET is referred to also as an N-type FinFET and the P-channel FinFET is referred to also as a P-type FinFET.

<<Threshold Voltage>>

A threshold voltage Vth of the planar FET is given by the following expression (1) when the effects of an interface state and the like can be ignored.

$$Vth = V_{FB} + 2\Phi_F + 1/C_{OX} \cdot [2\varepsilon_s \cdot q \cdot N_B \cdot (2\Phi_F - V_{BB})]^{0.5} \quad (1)$$

wherein $V_{FB}$ denotes a flat band voltage, $\Phi_F$ denotes the Fermi level of a semiconductor substrate (channel), $\varepsilon_s$ denotes the dielectric constant of silicon, q denotes an elementary charge, $N_B$ denotes the impurity concentration of the semiconductor substrate (channel), $C_{OX}$ denotes the unit capacitance of a gate insulating film, and $V_{BB}$ denotes a substrate bias voltage to the semiconductor substrate. In the expression (1) shown above, parameters which can be changed in design are the impurity concentration $N_B$ of the semiconductor substrate (channel) and the substrate bias voltage $V_{BB}$ thereto. That is, in the planar FET, by changing either or each one of the two parameters, the threshold voltage can be adjusted to have an intended value.

By contrast, in the FinFET, by forming a fin region serving as a channel into the form of a thin film, during the operation of the FinFET, the channel is brought into a completely depleted state under an electric field effect due to gate electrodes disposed such that the fin region is interposed therebetween.

Figure 21A:
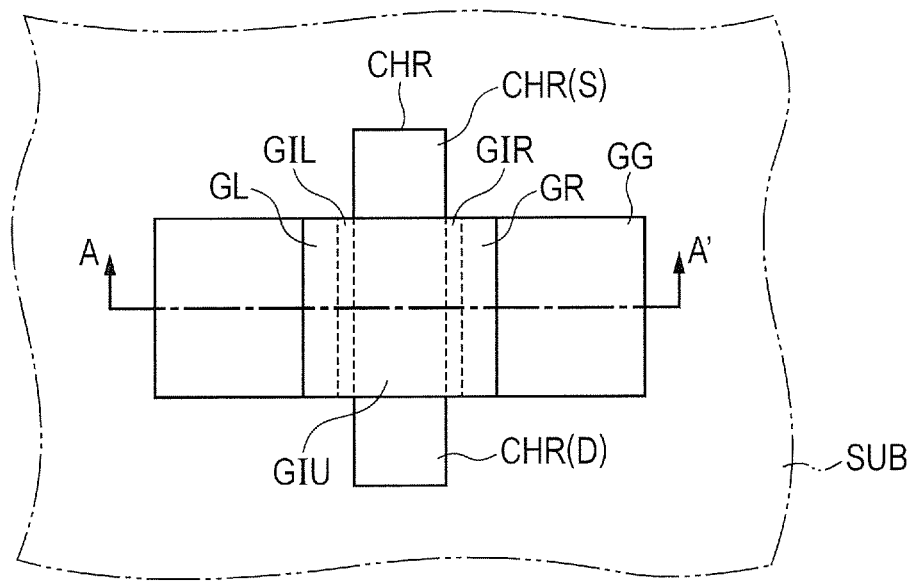
FIGS. 21A and 21B are a plan view and a cross-sectional view each showing a structure of a FinFET according to Embodiment 1.
Figure 21B:
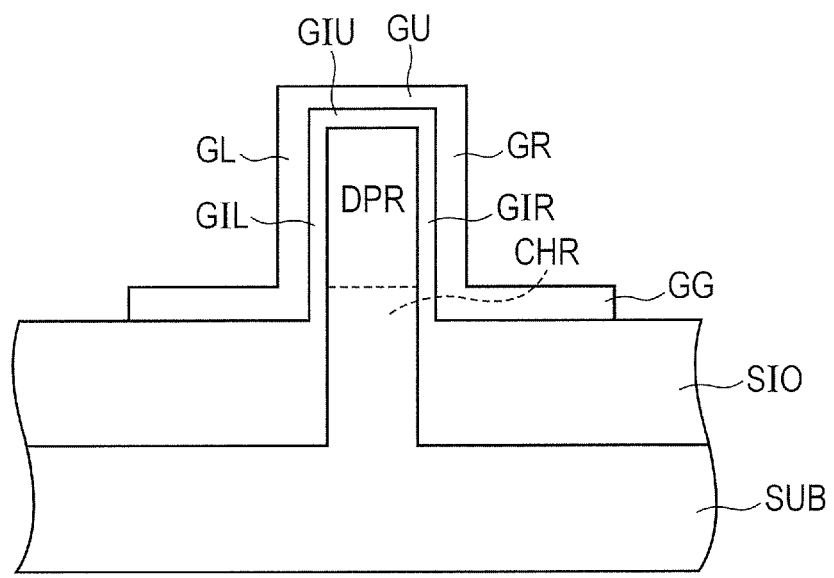

FIGS. 21A and 21B are a plan view and a cross-sectional view each schematically showing a structure of a FinFET according to Embodiment 1, of which FIG. 21A is a plan view schematically showing the structure of the FinFET and FIG. 21B is a schematic cross-sectional view showing a cross section along the line A-A' in FIG. 21A. As shown in FIG. 21B, a predetermined region of a semiconductor substrate SUB is configured to three-dimensionally project. As shown in FIG. 21A, a portion of a projecting semiconductor region CHR is covered with a gate electrode GG when viewed in plan view. The portions of the semiconductor region which are uncovered with the gate electrode GG serve as the source region and drain region of the FinFET, while the portion of the semiconductor region which is covered with the gate electrode GG serves as the channel of the FinFET. In FIG. 21A, the source region is denoted by a reference mark CHR(S) and the drain region is shown by a reference mark CHR(D). The source region CHR(S) is coupled to a source electrode and the drain region CHR(D) is coupled to a drain electrode, though the illustration thereof is omitted in FIGS. 21A and 21B.

The portion covered with the gate electrode GG will be described using FIG. 21B. Over the main surface of the semiconductor substrate SUB and the main surface of the projecting semiconductor region CHR, an insulating film SIO and a gate insulating film are formed. In FIG. 21B, the thin gate insulating film formed on the right side of the projecting semiconductor region CHR is denoted by a reference mark GIR, the thin gate insulating film formed on the left side of the semiconductor region CHR is denoted by a reference mark GIL, and the thin gate insulating film formed over the semiconductor region CHR is denoted by a reference mark GIU. Over the thin gate insulating films GIR, GIL, and GIU and a thick insulating film SIO, the gate electrode GG is formed.

The gate electrode GG has a gate electrode portion GR formed over the gate insulating film GIR, a gate electrode portion GL formed over the gate insulating film GIL, and a gate electrode portion GU formed over the gate insulating film GIU. The semiconductor region of the projecting semiconductor region CHR which is interposed between the gate electrode portions GR and GL via the gate insulating films GIR and GIL is denoted by a reference mark DPR. Note that, since the N-type FinFET is used herein as example, the semiconductor substrate SUB and the semiconductor region CHR are made of a P-type semiconductor.

Figure 22A:
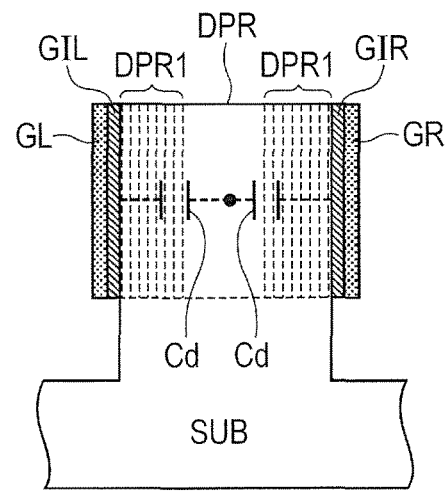
FIGS. 22A to 22C are views for illustrating the states of the FinFET.
Figure 22B:
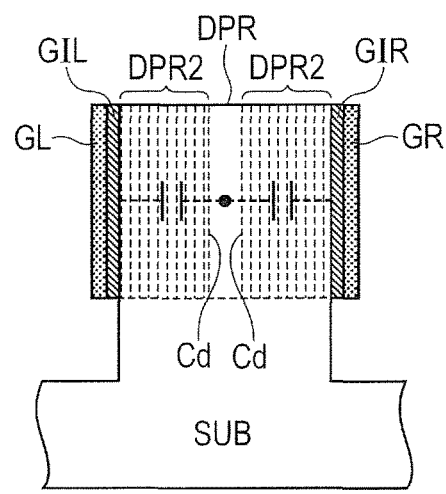
Figure 22C:
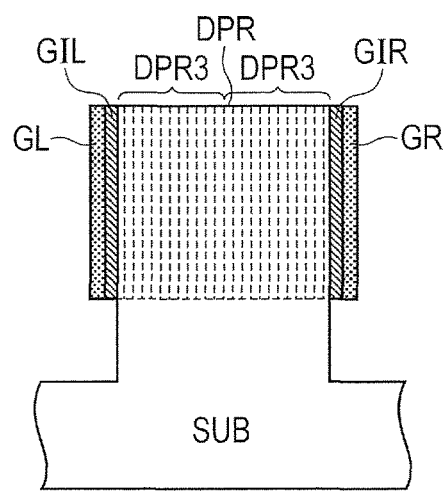

Next, a state when the potential supplied to the gate electrode GG is increased relative to the potential in the source electrode (source region CHR(S)), i.e., when the potential supplied to the gate electrode GG is changed so as to increase a gate-source voltage Vgs will be schematically described using FIGS. 22A, 22B, and 22C.

FIGS. 22A, 22B, and 22C are schematic views for illustrating the state of the FinFET. FIGS. 22A, 22B, and 22C show the states of the semiconductor region DPR when the gate-source voltage Vgs is progressively increased. That is, FIG. 22A shows the state when a first gate-source voltage Vgs is supplied and FIG. 22B shows the state when a second gate-source voltage Vgs higher than the first gate-source voltage Vgs is supplied. FIG. 22C shows the state where a third gate-source voltage Vgs higher than the second gate-source voltage Vgs is supplied.

Due to the supply of potentials to the gate electrode portions GL and GR, in the semiconductor region DPR interposed between the gate electrode portions GL and GR, a depletion layer is generated. In this case, since the gate electrode portions GL and GR are electrically coupled to each other by the gate electrode portion GU, a potential change in the gate electrode portion GL is synchronized with a potential change in the gate electrode portion GR. That is, the FinFET has an opposed-gate gate electrode including at least the pair of gate electrode portions (gate electrodes) GL and GR disposed to be opposed to each other such that the semiconductor region DPR where the channel is formed is interposed therebetween. To the pair of gate electrode portions GL and GR, voltages or signals are supplied in synchronization. By supplying, e.g., voltages to the gate electrode portions GL and GR disposed such that the semiconductor region DPR is interposed therebetween via the gate oxide films GIL and GIR, a depletion layer is generated from the vicinity of each of the gate electrodes GL and GR.

When the first gate-source voltage Vgs is supplied, as shown in FIG. 22A, a depletion layer DPR1 is generated from the vicinity of each of the gate electrode portions GL and GR. In this state, in the semiconductor region DPR, a non-depleted region is present between the depletion layers DPR1. The non-depleted region functions as the electrode of each of depletion layer capacitors (substrate capacitors) Cd. Consequently, between the gate electrode portions GL and GR and the semiconductor substrate SUB, the depletion layer capacitors Cd are formed.

When the gate-source voltage Vgs is increased and the second gate-source voltage is supplied, as shown in FIG. 22B, the depleted regions expand so that the depletion layers DPR1 shown in FIG. 22A expand to depletion layers DRP2 to reduce the non-depleted region. Since the depletion layers expand to be larger than in FIG. 22A, the value of each of the depletion layer capacitors Cd decreases.

When the gate-source voltage Vgs is further increased and the third gate-source voltage is supplied, as shown in FIG. 22C, the depleted regions expand so that the depletion layers DPR2 shown in FIG. 22B expand to depletion layers DRP3. In this state, the depletion layers DPR3 generated with the respective voltages supplied to the gate electrode portions GL and GR are in contact with each other so that the non-depleted region no longer exists in the semiconductor region DPR. This brings the semiconductor region DPR into a completely depleted state. Since there is no non-depleted region, there is no region which functions as the electrode of each of the depletion layer capacitors Cd so that the depletion layer capacitors CD no longer exist between the gate electrode portions GL and GR and the semiconductor substrate SUB.

As shown in FIG. 22C, the FinFET operates in a completely depleted state. In the completely depleted state, the depletion layer capacitors Cd do not exist so that the FinFET has the characteristic feature of an excellent switching characteristic. Note that, over the semiconductor region DPR, the gate electrode portion GU is formed, as shown in FIG. 21, though the illustration thereof is omitted in FIGS. 22A to 22C. Since the gate insulating film interposed between the gate electrode portion GU and the semiconductor region DPR is the thin gate insulating film GIU, when the gate-source voltage Vgs is supplied, depletion layers are formed also in the portion of the semiconductor region DPR which is located under the gate electrode portion GU.

Figure 23:
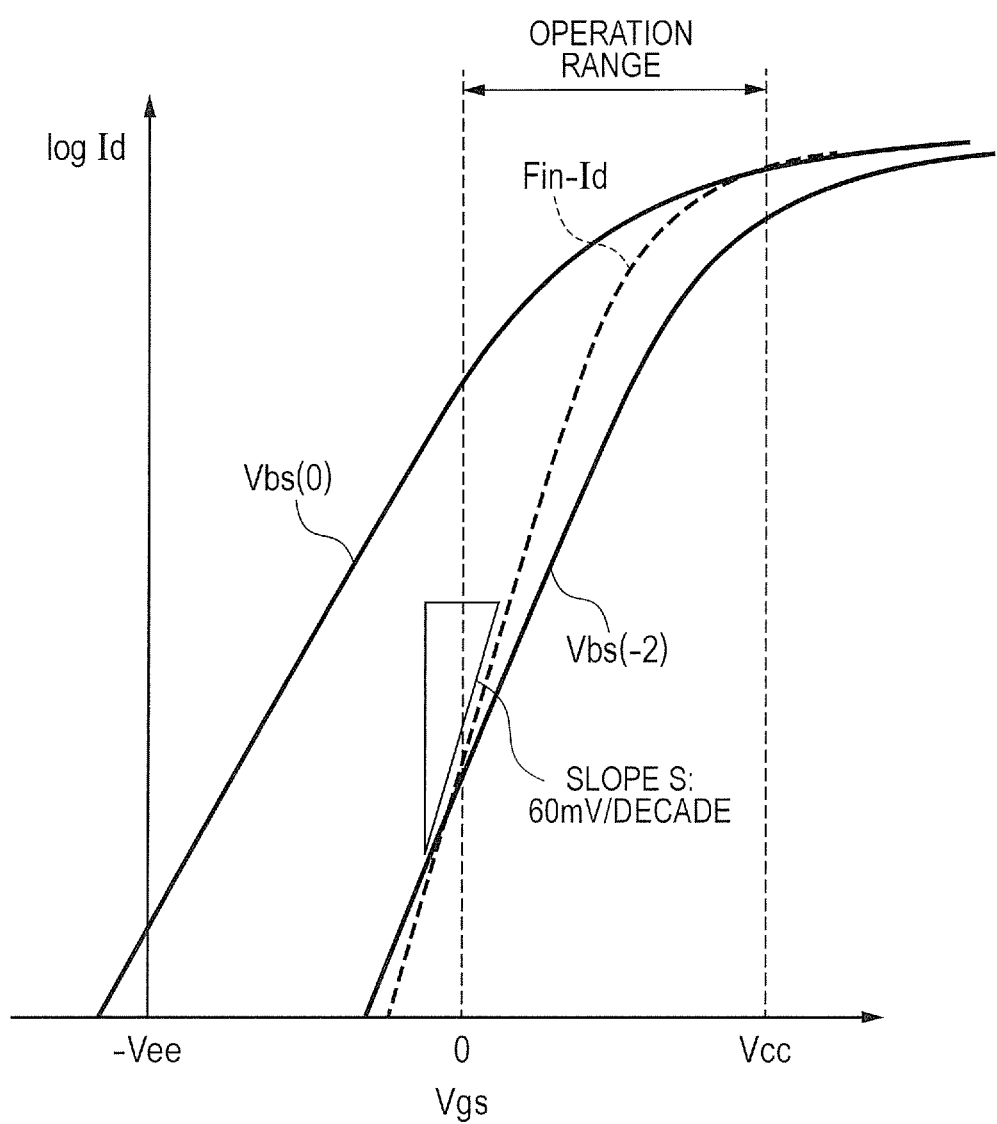
FIG. 23 is a characteristic diagram showing the characteristics of a planar FET and the FinFET.

FIG. 23 is a characteristic diagram showing the characteristics of the planar FET and the FinFET. In FIG. 23, the abscissa axis shows the gate-source voltage Vgs and the ordinate axis shows a drain current Id. The ordinate axis uses a logarithmic scale (e.g., a common logarithmic scale). That is, in FIG. 23, the drain current Id is shown as a logarithmic number. In FIG. 23, the solid lines Vbs(0) and Vbs(−2) are drain current characteristic curves each showing a change in drain current Id when the gate-source voltage Vgs is changed in the planar FET. The broken line Fin-Id is a drain current characteristic curve showing a change in drain current Id when the gate-source voltage Vgs is changed in the FinFET.

In FIG. 23, the drain current characteristic curve Vbs(0) shows a change in drain current when a substrate bias voltage of 0 V is applied to the semiconductor substrate, and the drain current characteristic curve Vbs(−2) shows a change in drain current when a substrate bias voltage of −2 V is applied to the semiconductor substrate. As shown in FIG. 23, depending on the substrate bias voltage applied to the semiconductor substrate, the drain current allowed to flow changes. That is, in the planar FET, the threshold voltage can be adjusted using the substrate bias voltage applied to the semiconductor substrate.

In the FinFET, as shown in the drain current characteristic curve Fin-Id, the rise of the drain current Id is steep so that an excellent switching characteristic can be obtained. That is, it is possible to adjust the slope S of the drain current Id to 60 mV/decade at a room temperature as a logic limit. Here, 60 mV/decade shows that a variation in gate-source voltage Vgs which is required to change the drain current Id by one decade magnitude on a logarithmic scale is 60 mV.

However, in the FinFET, the depletion layer capacitors Cd do not exist so that, even when the substrate bias voltage applied to the semiconductor substrate is changed, a voltage in the channel does not substantially change. Accordingly, the threshold voltage of the FinFET is hard to adjust (control) using the substrate bias voltage. In addition, since the semiconductor region DPR interposed between the gate electrodes GL and GR is made of a thin film, the number of impurity ions in the channel formed in the semiconductor region DPR is limited. As a result, even by using the impurity in the channel, the threshold voltage is hard to adjust (control). In other words, there is the problem that it is difficult to set the threshold voltage of the FinFET to an intended value.

<<Nonvolatile Memory>>

Next, a problem encountered when a FinFET is used for a nonvolatile memory cell having a split-gate structure will be described. As described above, the nonvolatile memory cell having the split-gate structure has a configuration in which the selection transistor corresponding to the selection gate electrode and the memory transistor corresponding to the memory gate electrode are coupled in series to each other. In such a nonvolatile memory cell, by storing charges corresponding to information in the charge trapping layer (silicon nitride film) of the memory transistor, information is written and retained. To avoid a disturb to the information retained in the memory transistor, when the nonvolatile memory cell is in the non-selected state, it is necessary to bring the selection transistor into the stable OFF state.

For example, when the selection transistor is not in the stable OFF state in the nonvolatile memory cell in the non-selected state, there is a concern that a leakage current flows from the selection transistor to the memory transistor coupled in series thereto to destroy the information retained in the memory transistor. Brining the selection transistor into the stable OFF state is equivalent to increasing the threshold voltage of the selection transistor in terms of the characteristics of the selection transistor. That is, by increasing the threshold voltage of the selection transistor, it is possible to further reduce the leakage current flowing in the selection transistor.

To reduce the size of the nonvolatile memory cell having the split-gate structure, the selection transistor and the memory transistor are formed using a self-alignment process. Consequently, the threshold voltage of the selection transistor and the threshold voltage of the memory transistor are not completely independent of each other. For example, when the selection transistor is formed first, an impurity which determines the threshold voltage of the selection transistor is implanted. At this time, the impurity is also implanted into the memory transistor. After the formation of the selection transistor, by implanting an impurity having an opposite conductivity type using the selection gate electrode of the selection transistor as a mask, it is possible to adjust the impurity implanted in the memory transistor and thus take measures against the incompletely independent threshold voltages of the selection transistor and the memory transistor. However, since the respective threshold voltages of the selection transistor and the memory transistor are not completely independent factors, the degree of freedom in a process for setting the threshold voltages is low and it is difficult to arbitrarily set the respective threshold voltages of the selection transistor and the memory transistor.

Since the FinFET is operated in a completely depleted state and the number of impurity ions in the semiconductor region interposed between the gate electrodes is also limited, it is difficult to control the threshold voltages, as described above. Consequently, when the use of the FinFET for the nonvolatile memory cell having the split-gate structure is considered, it is difficult to control the threshold voltage of the selection transistor. For example, if the threshold voltage of the selection transistor formed of the FinFET is low, when the nonvolatile memory cell is in the non-selected state, the leakage current flowing in the selection transistor increases to lead to the destruction of the retained information.

<Configuration of Semiconductor Device Using Planar FET>

For easier understanding of Embodiment 1, first, the semiconductor device having the nonvolatile memory cell having the split-gate structure including the planar FET will be described. The nonvolatile memory cell is hereinafter simply referred to also as a memory cell.

<<Memory Cell Using Planar FET>>

Figure 17A:
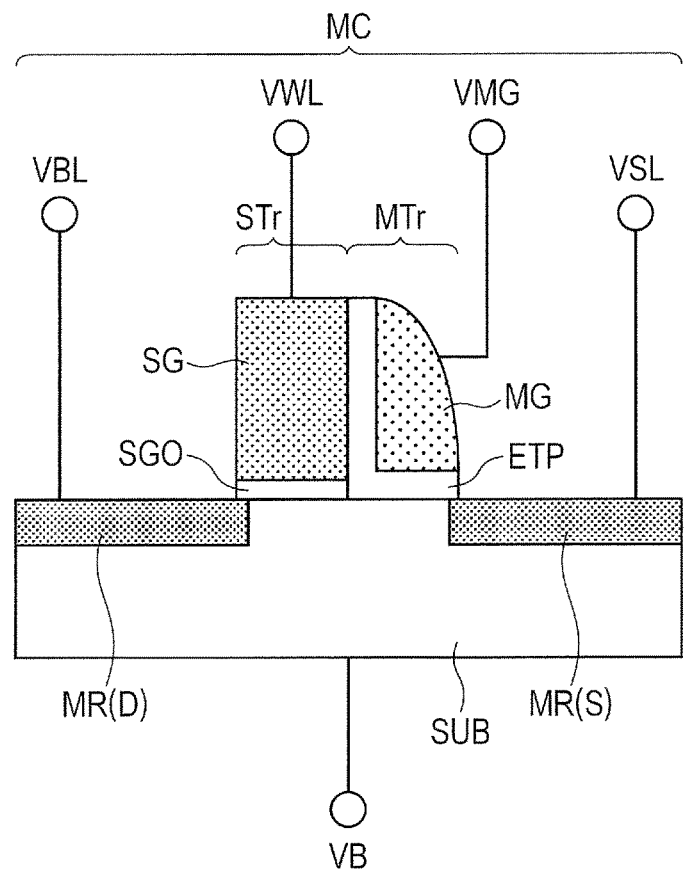
FIGS. 17A and 17B are views each showing a configuration of a nonvolatile memory cell.
Figure 17B:
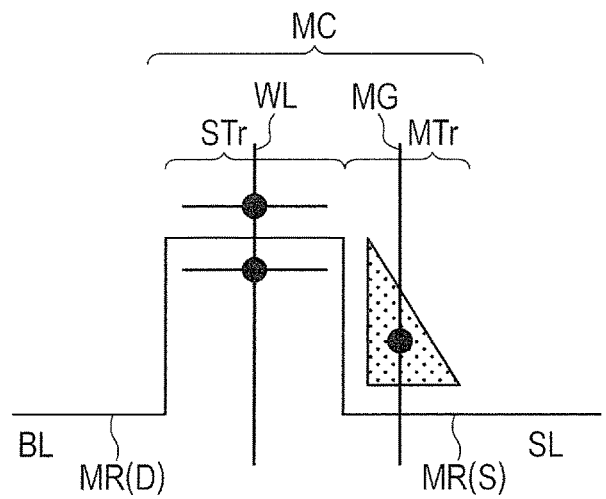

FIGS. 17A and 17B are views schematically showing a structure of a memory cell MC, of which FIG. 17A is a schematic cross-sectional view of the memory cell MC and FIG. 17B is a circuit diagram showing circuit symbols for the memory cell MC. The cross section shown in FIG. 17A shows the case where the memory cell is formed of a planar FET. As will be described later in detail, even when the memory cell is formed of a FinFET, the cross section of the memory cell including an active region (fin) is the same as that of the memory cell formed of the planar FET. That is, when the active region is viewed, the cross section of the memory cell formed of the FinFET also has the cross-sectional structure shown in FIG. 17A. Accordingly, the memory cell formed of the FinFET will also be described using the circuit symbols shown in FIG. 17B.

In FIG. 17A, SUB denotes a semiconductor substrate. When the planar FET is an N-channel FET, the semiconductor substrate is made of a P-type semiconductor. In the P-type semiconductor substrate SUB, the pair of semiconductor regions MR(D) and MR(S) each made of an N-type semiconductor are formed to be spaced apart from each other with a predetermined space interposed therebetween. In the semiconductor substrate SUB, the semiconductor region interposed between the pair of semiconductor regions MR(D) and MR(S) serves as a semiconductor region where a channel is formed. Over the area of the main surface of the semiconductor region where the channel is formed which is proximate to the semiconductor region MR(D), a gate insulating film SGO is formed. Over the main surface of the gate insulating film SGO, a conductive selection gate electrode SG is formed.

On the other hand, over the area of the main surface of the semiconductor region where the channel is formed which is proximate to the semiconductor region MR(S), a charge storage layer (charge trapping film) ETP is formed. Over the main surface of the charge storage layer ETP, a conductive memory gate electrode MG is formed. FIG. 17A shows only the charge storage layer ETP interposed between the memory gate electrode MG and the semiconductor region where the channel is formed. However, between the memory gate electrode MG and the semiconductor region where the channel is formed, the charge storage layer ETP is further interposed between insulating films not shown.

Between the selection gate electrode SG and the memory gate electrode MG, the charge storage layer ETP is interposed, though what is interposed therebetween is not particularly limited thereto. Between the selection gate electrode SG and the memory gate electrode MG, instead of the charge storage layer ETP, an insulating film may also be interposed.

The memory cell MC includes the pair of semiconductor regions MR(D) and MR(S) described above, the selection gate electrode SG disposed over the semiconductor region where the channel is formed, and the memory gate electrode MG disposed over the semiconductor region where the channel is formed via the charge storage layer ETP. In accordance with the voltage supplied to the selection gate electrode SG, e.g., the channel is formed in the semiconductor region under the selection gate electrode SG to allow a current to flow. Also, the charges (e.g., holes) stored in the charge storage layer ETP form the channel in the semiconductor region under the memory gate electrode MG to allow a current to flow. Accordingly, it can be assumed that the memory cell includes a selection transistor STr corresponding to the selection gate electrode SG and a memory transistor MTr corresponding to the memory gate electrode MG, and these transistors are coupled in series to each other.

In this case, each of the pair of semiconductor regions MR(D) and MR(S) can be regarded as the drain region or the source region of the memory cell MC. Which one of the semiconductor regions MF(D) and MR(S) functions as the drain region or the source region is determined by the voltages supplied to the semiconductor regions MR(D) and MR(S). For ease of explanation, in the description of the present specification, it is assumed that that the semiconductor region MR(D) coupled to a bit line described later is the drain region and the semiconductor region MR(S) coupled to a source line is the source region.

When the memory cell MC is formed of the planar FET, a predetermined substrate bias voltage is applied to the semiconductor substrate SUB to adjust the threshold voltage of the selection transistor STr included in the memory cell MC or the like.

In FIG. 17B, WL denotes a word line, BL denotes the bit line, and SL denotes the source line. The wiring line coupled to the memory gate electrode MG shows a memory gate line. In FIG. 17, for the convenience of explanation, the memory gate line will also be described using the same reference numeral MG as used for the memory gate electrode. The word line WL is coupled to the selection gate electrode SG of the memory cell MC, while the memory gate line MG is coupled to the memory gate electrode MG of the memory cell MC. The bit line BL is coupled to the semiconductor region MR(D) of the memory cell MC, while the source line SL is coupled to the semiconductor region MR(S) of the memory cell MC. In the present specification, the semiconductor region MR(D) is referred to as the drain region and the semiconductor region MR(S) is referred to as the source region. Accordingly, the bit line BL is coupled to the drain region MR(D) of the memory cell MC, while the source line SL is coupled to the source region MR(S) of the memory cell MC. In FIG. 17A, VWL denotes a voltage in the word line WL, VMG denotes a voltage in the memory gate line MG, VLS denotes a voltage in the source line SL, VBL denotes a voltage in the bit line BL, and VB denotes the substrate bias voltage supplied to the semiconductor substrate SUB.

<<Nonvolatile Memory Module>>

Figure 18:
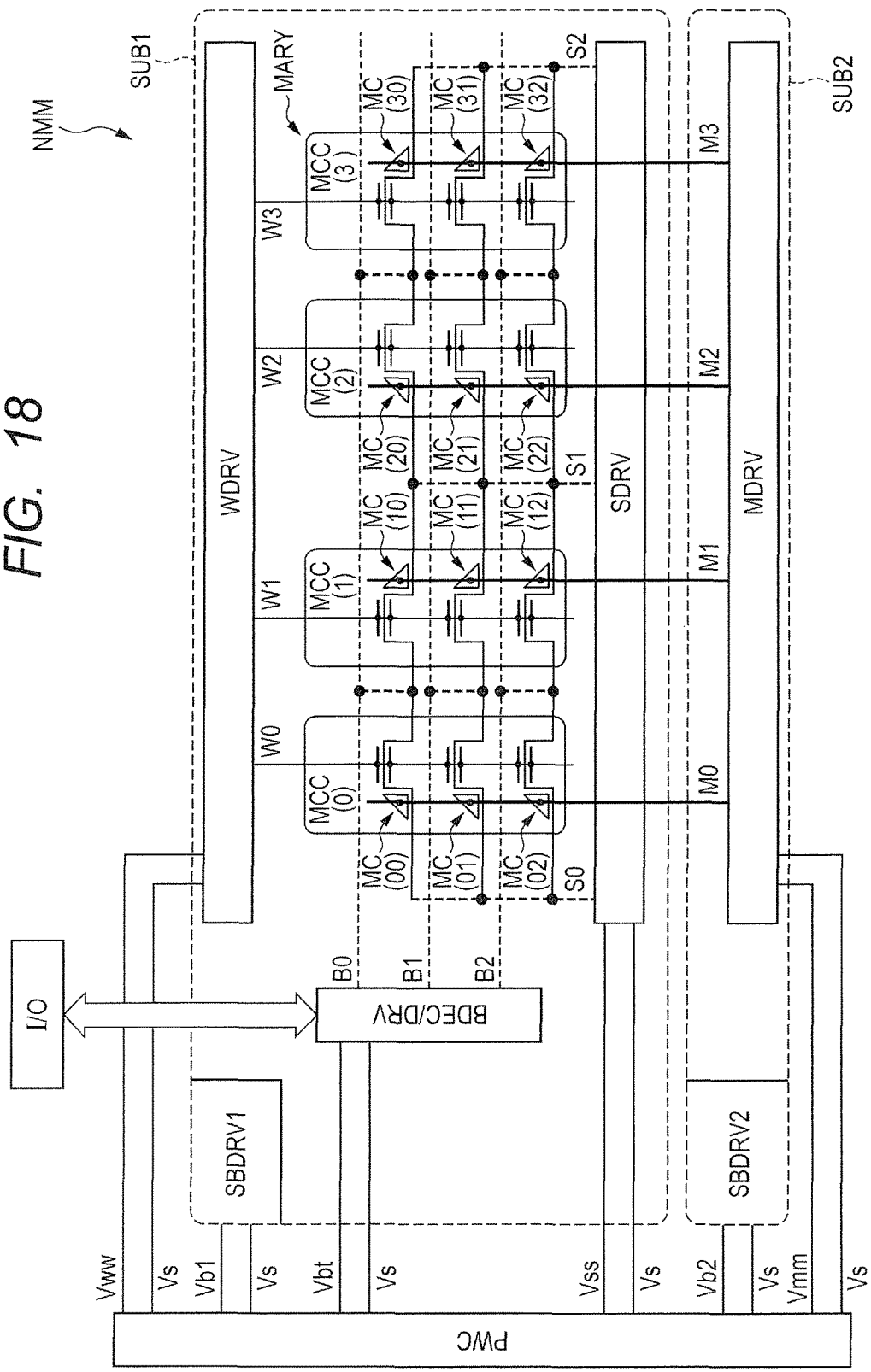
FIG. 18 is a block diagram showing a configuration of the nonvolatile memory module.

The semiconductor device includes a nonvolatile memory module NMM. FIG. 18 is a block diagram showing a configuration of the nonvolatile memory module NMM. In the nonvolatile memory module NMM, the memory cell MC described using FIG. 17 includes a memory array MARY disposed in the form of a matrix. In FIG. 18, of the memory array MARY, memory cells MC(00) to MC(32) arranged in three rows and four columns are shown as representatives.

In each of the rows of the memory array MARY, the two memory cells adjacent to each other are disposed such that the drain region MR(D) or the source region MR(S) is shared therebetween. For example, the memory cells MC(0) and MC(10) are disposed such that the drain region MR(D) is shared therebetween, and the memory cells MC(10) and MC(20) are disposed such that the source is shared therebetween.

In the individual rows (0-th to 2nd rows) of the memory array MARY, bit lines B0 to B2 are disposed on a one-to-one basis. Each of the bit lines is coupled to the common drain region MR(D) of the memory cells MC disposed in the same row. In the individual columns (0-th to 3rd columns) of the memory array MARY, word lines W0 to W3 and memory gate lines M0 to M3 are disposed on a one-to-one basis. In the memory array MARY, source lines S0 to S2 are disposed in every other column. Each of the word lines W0 to W3 is coupled to the selection gate electrode SG of each of the memory cells MC disposed in the same column. On the other hand, each of the memory gate lines M0 to M3 is coupled to the memory gate electrode MG of each of the memory cells disposed in the same column. Each of the source lines S0 to S2 disposed in every other column is coupled to the common source region MR(S).

The nonvolatile memory module NMM includes a word line driver circuit (first driver circuit) WDRV coupled to the word lines W0 to W3, a source line driver circuit SDRV coupled to the source lines S0 to S2, and a memory gate line driver circuit MDRV coupled to the memory gate lines M0 to M3. The nonvolatile memory module NMM also includes a bit line decoder/driver circuit BDEC/DRV coupled to the bit lines B0 to B2, an input/output circuit I/O, and a power supply circuit PWC.

The power supply circuit PWC forms a ground voltage Vs and appropriate power supply voltages Vww, Vb1, Vb2, Vbt, Vss, and Vmm. The power supply voltage Vww formed by the power supply circuit PWC is supplied to the word line driver circuit WDRV. The power supply voltage Vbt formed by the power supply circuit PWC is supplied to the bit line decoder/driver circuit BDEC/DRV. The power supply voltage Vss formed by the power supply circuit PWC is supplied to the source line driver circuit SDRV. The power supply voltage Vmm formed by the power supply circuit PWC is supplied to the memory gate line driver circuit MDRV. The power supply voltage Vb1 formed by the power supply circuit PWC is supplied to a substrate driver circuit SBDRV1. The power supply voltage Vb2 formed by the power supply circuit PWC is supplied to a substrate driver circuit SBDRV2. The ground voltage Vs formed by the power supply circuit PWC is supplied to each of the driver circuits described above.

As will be described later, in the nonvolatile memory module NMM shown in FIG. 18, the memory gate line driver circuit MDRV may output a voltage which is negative relative to the ground voltage Vs. Consequently, a semiconductor substrate (inside the broken line) SUB2 where the memory gate line driver circuit MDRV is formed is electrically isolated from the semiconductor substrate (inside the broken line) SUB1 where the memory array MARY or the like is formed. For example, in one semiconductor substrate, a first semiconductor region (well) and a second semiconductor region (well) are formed. Between the first and second semiconductor regions, an insulating region is formed to electrically isolate the first and second semiconductor regions from each other. The first semiconductor region thus formed is assumed to be the semiconductor substrate SUB1, while the second semiconductor region thus formed is assumed to be the semiconductor substrate SUB2.

In the first semiconductor region (semiconductor substrate SUB1), the memory array MARY, the word line driver circuit WDRV, the source line driver circuit SDRV, the bit line decoder/driver circuit BDEC/DRV, and the substrate driver circuit SBDRV1 each described above are formed. To the first semiconductor substrate (SUB1), the voltage output from the substrate driver circuit SBDRV1 is supplied. In the second semiconductor region (SUB2), the memory gate line driver circuit MDRV and the substrate driver circuit SBDRV2 each described above are formed. To the second semiconductor region (SUB2), the voltage output from the substrate driver circuit SBDRV2 is supplied.

It is assumed that, among the word lines W0 to W3, the word line specified by a column address signal not shown is a selected word line and the word lines not specified by the column address signal are non-selected word lines. The word line driver circuit WDRV forms a word line selection voltage and a word line non-selection voltage on the basis of the power supply voltage Vww and the ground voltage Vs which are supplied thereto and supplies the word line selection voltage to the selected word line, while supplying the word line non-selection voltage to the non-selected word lines.

It is also assumed that, among the source lines S0 to S2, the source line specified by the column address signal is a selected source line and the source lines not specified by the column address signal are non-selected source lines. The source line driver circuit SDRV forms a source line selection voltage and a source line non-selection voltage on the basis of the power supply voltage Vss and the ground voltage Vs and supplies the source line selection voltage to the selected source line, while supplying the source line non-selection voltage to the non-selected source lines.

Likewise, it is assumed that, among the memory gate lines M0 to M3, the memory gate line specified by the column address signal is a selected memory gate line and the memory gate lines not specified by the column address signal are non-selected memory gate lines. The memory gate line driver circuit MDRV forms a memory gate line selection voltage and a memory gate line non-selection voltage on the basis of the power supply voltage Vmm and the ground voltage Vs. The formed memory gate line selection voltage is supplied to the selected memory gate line, while the memory gate line non-selection voltage is supplied to the non-selected memory gate lines.

The bit line decoder/driver circuit BDEC/DRV decodes a row address signal not shown and selects the bit line specified by the row address signal from among the bit lines B0 to B2. To the bit line selected by the bit line decoder/driver circuit BDEC/DRV, i.e., the selected bit line, the bit line decoder/driver circuit BDEC/DRV supplies a bit line selection voltage based on the power supply voltage Vbt and the ground voltage Vs. Note that, during a write operation, the bit line selection voltage supplied from the bit line decoder/driver circuit BDEC/DRV to the selected bit line changes in accordance with information to be written from the input/output circuit I/O.

<<Operation of Memory Cell Including Planar FET>>

FIGS. 19A and 19B are views showing the bias voltages supplied to the memory cells shown in FIGS. 17 and 18 in an erase operation, a write operation, and a read operation.

A description will be given herein of the case where, in the memory array MARY shown in FIG. 18, a memory cell column MCC(1) is specified as a first column by the column address signal so that the memory cell column MCC(1) is selected. In other words, a memory cell column MCC(0) as a 0-th column, a memory cell column MCC(2) as a second column, and a memory cell column MCC(3) as a third column are in a non-selected state. At this time, a first row in the memory array MARY is specified by the row address signal so that the bit line B1 is selected. In other words, the bit lines B0 and B2 are non-selected bit lines. As a result, among the memory cells MC(00) to MC(32), the memory cell MC(11) coupled to the word line W1 and the bit line B1 is selected.

In FIG. 19A, VBL shows a voltage in the bit line coupled to the selected memory cell MC(11). In other words, the value of the voltage VBL in the bit line can be regarded to show the value of the bit-line selection voltage supplied from the bit line decoder/driver circuit BDEC/DRV to the selected bit line B1. VWL denotes a voltage in the word line coupled to the selected memory cell MC(11). The value of the voltage VWL in the word line can be regarded to show the value of the word line selection voltage supplied from the word line driver circuit WDRV to the selected word line W1. In FIG. 19A, VMG denotes a voltage in the memory gate line M1 coupled to the selected memory cell MC(11). Accordingly, the value of the voltage VMG in the memory gate line shows the value of the memory gate line selection voltage supplied from the memory gate line driver circuit MDRV to the selected memory gate line M1. VSL shows a voltage in the source line coupled to the selected memory cell MC(11). Accordingly, the value of the voltage VSL shows the value of the source line selection voltage supplied from the source line driver circuit SDRV to the selected source line S1.

In FIG. 19A, VB shows the substrate bias voltage supplied from the substrate driver circuit SBDRV1 to the semiconductor region (SUB1).

The bit line decoder/driver circuit BDEC/DRV sets the voltage VBL in the selection bit line B1 to the ground voltage Vs during the erase operation, to the ground voltage Vs or to a predetermined voltage Vc in accordance with the information to be written during the write operation, and to the predetermined voltage Vc during the read operation. On the other hand, the word line driver circuit WDRV sets the voltage VWL in the selected word line W1 to a predetermined voltage Vcge during the erase operation, to a predetermined voltage Vcgp during the write operation, and to the voltage Vc during the read operation.

The memory gate line driver circuit MDRV sets the voltage VMG in the selected memory gate line M1 to a predetermined voltage Vmge during the erase operation, to a predetermined voltage Vmgp during the write operation, and to the ground voltage Vs during the read operation. On the other hand, the source line driver circuit SDRV sets the voltage VSL in the selected source line to a predetermined voltage Vse during the erase operation, to a predetermined voltage Vsp during the write operation, and to the ground voltage Vs during the read operation.

The substrate driver circuit SBDRV1 sets the substrate bias voltage VB supplied to the semiconductor region (SUB1) to the ground voltage Vs in each of the erase operation, the write operation, and the read operation.

FIG. 19B shows an example of the respective values of the ground voltage Vs and the voltages Vcge, Vcgp, Vmge, Vmgp, Vse, and Vsp each described above when the predetermined voltage Vc is assumed to be 1.5 V. By way of example, when the ground voltage Vs is 0 V and the predetermined voltage Vc is 1.5 V, the voltage Vmge is −5 V which is a negative voltage relative to the ground voltage Vs, while the voltage Vmgp is 10 V which is a positive voltage relative to the ground voltage Vs.

In the memory cell MC (MC(11)) shown in FIGS. 17A and 17B and FIG. 18, the write operation is performed using a method referred to as source-side injection. That is, to inject hot carrier electrons generated in the channel into the charge storage layer ETP, the respective channels of the selection transistor STr and the memory transistor MTr are brought into an ON state so that the high voltage Vmgp is supplied to the selected memory gate line M1. By contrast, in the erase operation, holes are generated using a band-to-band tunneling phenomenon caused by an electric field between the selected source line S1 and the selected memory gate line M1. The generated holes are accelerated by an electric field resulting from the potential difference between the selected source line voltage Vse and the semiconductor substrate voltage Vs, while the negative voltage Vmge is supplied to the selected memory gate line M1. The holes are thus injected into the charge storage layer ETP so that erasing is performed.

Thus, the memory gate line driver circuit MDRV is required to output the negative voltage (Vmge) relative to the ground voltage Vs during the erase operation and output the positive voltage (Vmgp) relative to the ground voltage Vs during the write operation. Accordingly, as described above, the memory gate line driver circuit MDRV is formed in the semiconductor region (SUB2) electrically isolated from the semiconductor region (SUB1) where the memory array MARY or the like is formed.

FIGS. 20A to 20D are views showing the respective states of the bias voltages supplied to the non-selected memory cells when the memory cell MC(11) is selected from among the memory cells MC(00) to MC(32) shown in FIG. 18, of which FIG. 20A shows the bias voltages supplied to the selected memory cell MC(11). Since FIG. 20A is the same as FIG. 19A, a description thereof is omitted.

FIG. 20B shows the bias voltages supplied to the non-selected memory cell MC(10). That is, in FIG. 20B, VBL, VWL, VMG, and VSL denote respective voltages in the bit line, the word line, the memory gate line, and the source line which are coupled to the non-selected memory cell MC(10). The non-selected memory cell MC(10) is coupled to the same word line W1 as coupled to the selected memory cell MC(11) and is coupled to the non-selected bit line B0. When the write operation is performed to the selected memory cell MC(11), the predetermined voltage Vc is supplied from the bit line decoder/driver circuit BDEC/DRV to the non-selected memory cell MC(10) via the non-selected bit line B0.

FIG. 20C shows the bias voltages supplied to the non-selected memory cell MC(01). That is, in FIG. 20C, VBL, VWL, VMG, and VSL denote respective voltages in the bit line, the word line, the memory gate line, and the source line which are coupled to the non-selected memory cell MC(01). The non-selected memory cell MC(01) is coupled to the same bit line B1 as coupled to the selected memory cell MC(11) and is coupled to each of the non-selected word line W0 and the non-selected source line S0. When the erase operation, the write operation, and the read operation are performed to the selected memory cell MC(11), the word line driver circuit WDRV supplies the voltages Vcge, Vcgp, and Vc to the selected word line W1, while supplying the ground voltage Vs to the non-selected word line W0. When the write operation is performed to the selected memory cell MC(11), the source line driver circuit SDRV supplies the ground voltage Vs to the non-selected source line S0.

FIG. 20D shows the bias voltages supplied to the non-selected memory cell MC(21). That is, in FIG. 20D, VBL, VWL, VMG, and VSL denote respective voltages in the bit line, the word line, the memory gate line, and the source line which are coupled to the non-selected memory cell MC(21). The non-selected memory cell MC(21) is coupled to the same selected bit line S1 and the same selected bit line B1 as coupled to the selected memory cell MC(11) and is coupled to the non-selected word line W2. Since the word line driver circuit WDRV supplies the ground voltage Vs to the non-selected word lines, as shown in FIG. 20D, the ground voltage Vs is supplied as the voltage VWL in the word line to the non-selected memory cell MC(21) during each of the erase operation, the write operation, and the read operation.

Thus, when each of the erase operation, the write operation, and the read operation is performed to the selected memory cell MC(11), each of the erase operation, the write operation, and the read operation is prevented from being performed to the non-selected memory cells.

As the planar FET included in the memory cell MC, the N-channel FET has been described by way of example. However, even when a P-channel FET is used, by reversing the positive and negative signs of the voltages shown in FIG. 19B, the same operations can be performed.

<Configuration of Semiconductor Device Having Memory Cells Using FinFETs>

FIG. 1 is a block diagram showing a configuration of a semiconductor device having the memory cells using the FinFETs according to Embodiment 1. The semiconductor device according to Embodiment 1 includes a plurality of circuit modules including the nonvolatile memory module NMM, but FIG. 1 mainly shows only the configuration of the nonvolatile memory module NMM.

Similarly to the nonvolatile memory module described using FIG. 18, the nonvolatile memory module NMM according to Embodiment 1 includes the memory array MARY, the word line driver circuit WDRV, the source line driver circuit SDRV, the memory gate line driver circuit MDRV, the bit line decoder/driver circuit BDEC/DRV, and the input/output circuit I/O. The nonvolatile memory module NMM according to Embodiment 1 further includes a power supply circuit PWC1, a threshold voltage determination circuit VDB, and the substrate driver circuits SBDRV1 to SBDRV3.

In Embodiment 1, the memory array MARY, the source line driver circuit SDRV, and the bit line decoder/driver circuit BDEC/DRV are formed in the single semiconductor region (first semiconductor region) SUB1. The memory gate line driver circuit MDRV is formed in the semiconductor region SUB2 electrically isolated from the semiconductor region SUB1. The word line driver circuit WDRV is formed in a semiconductor region (second semiconductor region) SUB3 electrically isolated from the semiconductor regions SUB1 and SUB2. For example, in the single semiconductor substrate, three wells corresponding to the semiconductor regions SUB1 to SUB3 are formed. Between the wells (semiconductor regions SUB1 to SUB3), insulating regions are interposed so as to electrically isolate the three wells (semiconductor regions SUB1 to SUB3) from each other.

In the semiconductor substrate SUB1, the substrate bias circuit SBDRV1 is further formed, and the substrate bias voltage formed by the substrate bias circuit SBDRV1 is supplied to the semiconductor substrate SUB1. Likewise, in the semiconductor substrate SUB2, the substrate bias circuit SBDRV2 is formed, and the substrate bias voltage formed by the substrate bias circuit SBDRV2 is supplied to the semiconductor substrate SUB2. In the semiconductor substrate SUB3, the substrate bias circuit SBDRV3 is formed, and the substrate bias voltage formed by the substrate bias circuit SBDRV3 is supplied to the semiconductor substrate SUB3.

Note that the input/output circuit I/O is formed in the semiconductor region SUB1, but the region where the input/output circuit I/O is formed is not limited thereto. For example, the input/output circuit I/O may also be formed in a semiconductor region electrically isolated from the semiconductor regions SUB1 to SUB3.

In the memory array MARY, the plurality of memory cells MC are arranged in the form of a matrix. Similarly to FIG. 18, FIG. 1 shows the memory cells MC(00) to MC(32) arranged in three rows and four columns by way of example. Also, in the memory array MARY, in the same manner as described using FIG. 18, the word liens W0 to W3 and the memory gate lines M0 to M3 are disposed in the individual columns on a one-to-one basis. Each of the plurality of memory cells (e.g., MC(00) to MC(02)) disposed in the same column is coupled to the word line (W0) and the memory gate line (M0) which are disposed in the same column. That is, as shown in FIG. 19, the word line (W0) is coupled to the selection gate electrode SG of the memory cell MC, and the memory gate line (M0) is coupled to the memory gate electrode MG of the memory cell MC.

As described using FIG. 18, the memory array MARY includes the source lines S0 to S2 disposed in every other column and the bit lines B0 to B2 disposed in the individual rows on a one-to-one basis. The two memory cells adjacent to each other in the row direction share the source region or the drain region. The shared source regions are coupled to the source lines S0 to S2. The shared drain regions are coupled to the bit lines B0 to B2. Since the arrangement of the memory cells MC in the memory array MARY will be described later using FIG. 2, no further description is given thereof herein.

To the word line driver circuit WDRV, a power supply voltage Vww1 and the ground voltage Vs which are formed by the power supply circuit PWC1 are supplied. A column address signal not shown specifies the word line from among the word lines W0 to W3. The specified word line serves as a selected word line, while the word lines not specified by the column address signal serve as non-selected word lines. The word line driver circuit WDRV forms a word line selection voltage and a word line non-selection voltage on the basis of the power supply voltage Vww1 and the ground voltage Vs each supplied thereto and supplies the word line selection voltage to the selected word line, while supplying the word line non-selection voltage to the non-selected word lines.

The column address signal not shown specifies the source line from among the source lines S0 to S2. The specified source line serves as a selected source line, while the unspecified source lines serve as non-selected source lines. To the source line driver circuit SDRV, the power supply voltage Vss and the ground voltage Vs which are formed by the power supply circuit PWC1 are supplied. The source line driver circuit SDRV forms a source line selection voltage and a source line non-selection voltage on the basis of these voltages. The formed source line selection voltage is supplied to the selected source line, while the formed source line non-selection voltage is supplied to the non-selected source lines.

The column address signal not shown specifies the memory gate line from among the memory gate lines M0 to M3. The specified memory gate line serves as a selected memory gate line, while the unspecified memory gate lines serve as non-selected memory gate lines. To the memory gate line driver circuit MDRV, the power supply voltage Vmm and the ground voltage Vs which are formed by the power supply circuit PWC1 are supplied. The memory gate line driver circuit MDRV forms a memory gate line selection voltage and a memory gate line non-selection voltage on the basis of these voltages. The formed memory gate line selection voltage is supplied to the selected memory gate line, while the formed memory gate line non-selection voltage is supplied to the non-selected memory gate lines.

The bit line decoder/driver circuit BDEC/DRV decodes a row address signal not shown, similarly to the bit line decoder/driver circuit described using FIG. 18 and selects the bit line specified by the row address signal. To the bit line decoder/driver circuit BDEC/DRV, the power supply voltage Vbt and the ground voltage Vs which are formed by the power supply circuit PWC1 are supplied. The bit line decoder/driver circuit BDEC/DRV forms a bit line selection voltage and a bit line non-selection voltage on the basis of these voltages and supplies the bit line selection voltage to the bit line (selected bit line) which is selected by the bit line decoder/driver circuit BDEC/DRV, while supplying the bit line non-selection voltage to the non-selected bit lines which are not specified by the row address signal.

During the read operation, a voltage change in the selected bit line is supplied as information from the bit line decoder/driver circuit BDEC/DRV to the input/output circuit. On the other hand, during the write operation, the value of the bit line selection voltage formed by the bit line decoder/driver circuit BDEC/DRV changes on the basis of information from the input/output circuit I/O.

In Embodiment 1, to the substrate bias circuit SBDRV1, the power supply voltage Vb1 and the ground voltage Vs which are formed by the power supply circuit PWC1 are supplied. The substrate bias circuit SBDRV1 forms the substrate bias voltage VB on the basis of these voltages and supplies the substrate bias voltage VB to the corresponding semiconductor region SUB1. To the substrate bias circuit SBDRV2, the power supply voltage Vb2 and the ground voltage Vs which are formed by the power supply circuit PWC1 are supplied. The substrate bias circuit SBDRV2 forms the substrate bias voltage on the basis of these voltages and supplies the substrate bias voltage to the corresponding semiconductor region SUB2. Likewise, to the substrate bias circuit SBDRV3, a power supply voltage Vb3 formed by the power supply circuit PWC1 and the ground voltage Vs are supplied. The substrate bias circuit SBDRV3 forms a substrate bias voltage on the basis of these voltages and supplies the substrate bias voltage to the corresponding semiconductor region SUB3.

Since the semiconductor regions SUB1 to SUB3 are electrically isolated from each other, the respective voltages in the individual semiconductor regions are determined in accordance with the substrate bias voltages supplied from the corresponding substrate bias circuits. In addition, since the semiconductor regions SUB1 to SUB3 are electrically isolated from each other, it is possible to cause the word line driver circuit WDRV or the memory gate line driver circuit MDRV formed in the semiconductor region SUB2 or SUB3 to form, e.g., a voltage which is negative or/and positive relative to the ground voltage Vs in the memory array MARY formed in the semiconductor substrate SUB1 and supply the formed voltage to the memory array MARY via the word line or the memory gate line.

The threshold voltage determination circuit VDB determines the threshold voltage of the selection transistor STr included in the memory cell MC and supplies the determination result to the power supply circuit PWC1. The power supply circuit PWC1 forms the power supply voltages Vww1, Vbt, Vss, Vmm, Vb1, Vb2, and Vb3 on the basis of the determination result from the threshold voltage determination circuit VDB and outputs the power supply voltages Vww1, Vbt, Vss, Vmm, Vb1, Vb2, and Vb3. The power supply circuit PWC1 also outputs the ground voltage Vs.

Since the threshold voltage determination circuit VDB will be described later by way of example, a detailed description thereof is omitted herein. Voltages output from the respective driver circuits on the basis of the voltages formed by the power supply circuit PWC1 will also be described later so that a description thereof is omitted herein.

<<Arrangement of Memory Cells in Memory Array>>

Figure 2:
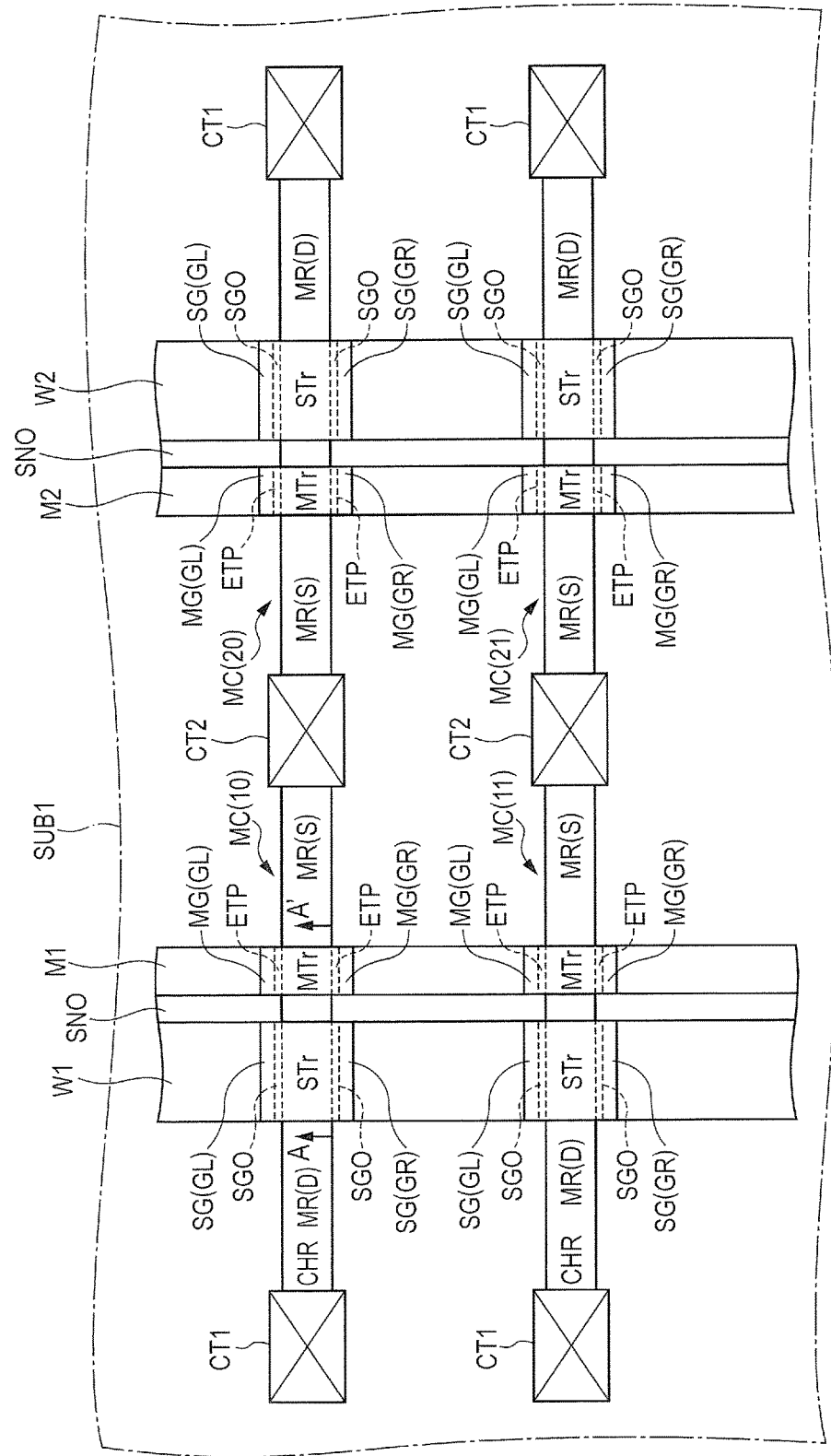
FIG. 2 is a plan view schematically showing a portion of a memory array according to Embodiment 1.

FIG. 2 is a plan view schematically showing portions of the memory array MARY according to Embodiment 1. FIG. 2 shows portions corresponding to the memory cells MC(10), MC(11), MC(20), and MC(21) shown in FIG. 1.

The word lines W0 to W3, the memory gate lines M0 to M3, and the source lines S0 to S3 each shown in FIG. 1 extend in parallel with each other when viewed in plan view. The bit lines B0 to B2 also extend in parallel with each other to be orthogonal to the word lines W0 to W3, the memory gate lines M0 to M3, and the source lines S0 to S2.

When viewed in plan view, over the main surface of the semiconductor substrate SUB1, a plurality of the semiconductor regions CHR are sterically (three-dimensionally) disposed. In FIG. 2, the plurality of individual semiconductor regions CHR laterally extend in parallel with each other, though the manner in which the plurality of semiconductor regions CHR are disposed is not particularly limited. A plurality of conductive layers serving as the word lines W1 and W2 are disposed so as to be orthogonal to the plurality of semiconductor regions CHR. In addition, conductive layers serving as the memory gate lines M1 and M2 are disposed so as to be orthogonal to the plurality of semiconductor regions CHR and proximate to the word lines W1 and W2. Between the conductive layers serving as the word lines W1 and W2 and the conductive layers serving as the memory gate lines M1 and M2, silicon nitride films SNO are disposed to electrically isolate the word lines and the memory gate lines from each other.

In FIG. 2, in the areas where the conductive layers serving as the word lines W1 and W2 and the semiconductor regions CHR intersect each other, gate insulating films SGO are disposed. On the other hand, in the areas where the conductive layers serving as the memory gate lines M1 and M2 and the semiconductor regions CHR intersect each other, the charge storage layers ETP are disposed. As described using FIG. 17, each of the charge storage layers ETP is interposed between the insulating layers, but the insulating layers are omitted also in FIG. 2.

The areas of the word lines W1 and W2 which are in contact with the side surfaces of the semiconductor regions CHR via the gate insulating layers SGO function as the selection gate electrodes SG of the selection transistors STr. The areas of the memory gate lines M1 and M2 which are in contact with the side surfaces of the semiconductor regions CHR via the charge storage layers ETP function as the memory gate electrodes MG of the memory transistors MTr. That is, the conductive layers serving as the word lines W1 and W2 are integral with the gate electrodes of the selection transistors STr, and the conductive layers serving as the gate electrodes M1 and M2 are integral with the gate electrodes of the memory transistors MTr. Since the conductive layers serving as the word lines W1 and W2 are disposed such that the semiconductor regions CHR are interposed therebetween, the word lines W1 and W2 are in contact with the two side surfaces of each of the semiconductor regions. In FIG. 2, the selection gate electrodes in contact with the upper side surfaces are denoted by SG(GL) and the selection gate electrodes in contact with the lower side surfaces are denoted by SG(GR). The same applies also to the memory gate electrodes. The memory gate electrodes in contact with the upper surfaces are denoted by MG(GL) and the memory gate electrodes in contact with the lower surfaces are denoted by MG(GR).

Since the selection gate electrodes SG(GL) and the selection gate electrodes SG(GR) are coupled to each other by the conductive layers disposed over the semiconductor regions CHR, voltages (signals) are supplied thereto in synchronization. Likewise, voltages (signals) are also supplied to the memory gate electrodes MG(GL) and MG(GR) in synchronization. That is, each of the selection transistors STr has the pair of selection gate electrodes which are disposed to be opposed to each other such that the semiconductor region CHR is interposed therebetween and to which the synchronized voltages (signals) are supplied. Each of the memory transistors MTr also has the pair of memory gate electrodes disposed to be opposed to each other such that the charge storage layer ETP and the semiconductor region CHR are interposed therebetween and to which the synchronized voltages (signals) are supplied. In each of the selection transistors STr, the pair of selection gate electrodes function similarly to each other. Therefore, in the present specification, the pair of selection transistors are referred to also as an opposed-gate selection gate electrode. Likewise, the pair of memory gate electrodes also function similarly to each other. Therefore, in the present specification, the pair of memory gate electrodes are referred to also as an opposed-gate memory gate electrode.

Of each of the semiconductor regions CHR, the areas which overlap none of the conductive layers serving as the word lines W1 and W2, the silicon nitride films SNO, and the conductive layers serving as the memory gate electrodes M1 and M2 serve as the drain regions MR(D) and the source regions MR(S) of the memory cells MC. That is, each of the memory cells MC has a split-gate structure including the opposed-gate selection gate electrode, the opposed-gate memory gate electrode, the drain region MR(D), and the source region MR(S). As described above, the drain region and the source region, which are determined by the potentials supplied thereto, can be regarded as a pair of semiconductor regions or a pair of terminals.

In FIG. 2, the conductive layers serving as the memory gate lines M1 and M2 are disposed so as to be opposed to each other in plan view. The conductive layer serving as the word line W2 (W1) is disposed so as to be opposed to a conductive layer serving as an adjacent word line W3 (W0) not shown in plan view. Accordingly, between the memory cells MC(10) and MC(20), the source region MR(S) is shared. Also, between the memory cells MC(10) and MC(00), the drain region MR(D) is shared and, between the memory cell MC(20) and the memory cell MC(30) not shown also, the drain region MR(D) is shared. Likewise, in each of the other memory cells also, each of the source region and the drain region is shared between the memory cells which are adjacent in the extending direction of each of the semiconductor regions CHR.

In FIG. 2, CT1 denotes a contact which electrically couples the semiconductor region CHR to a source line not shown. On the other hand, CT2 denotes a contact which electrically couples the semiconductor region CHR to a bit line not shown. A cross section along the line A-A' shown in FIG. 2 corresponds to the cross-sectional view shown in FIG. 17A.

FIG. 2 illustrates the case where each of the memory cells MC is configured to include the selection transistor STr and the memory transistor MTr each formed of the FinFET. However, the configuration of the memory cell MC is not limited thereto. That is, it may also be possible to form the selection transistor STr of a FinFET and form the memory transistor MTr of, e.g., a planar FET.

<<Threshold Voltage Determination Circuit>>

Figure 3:
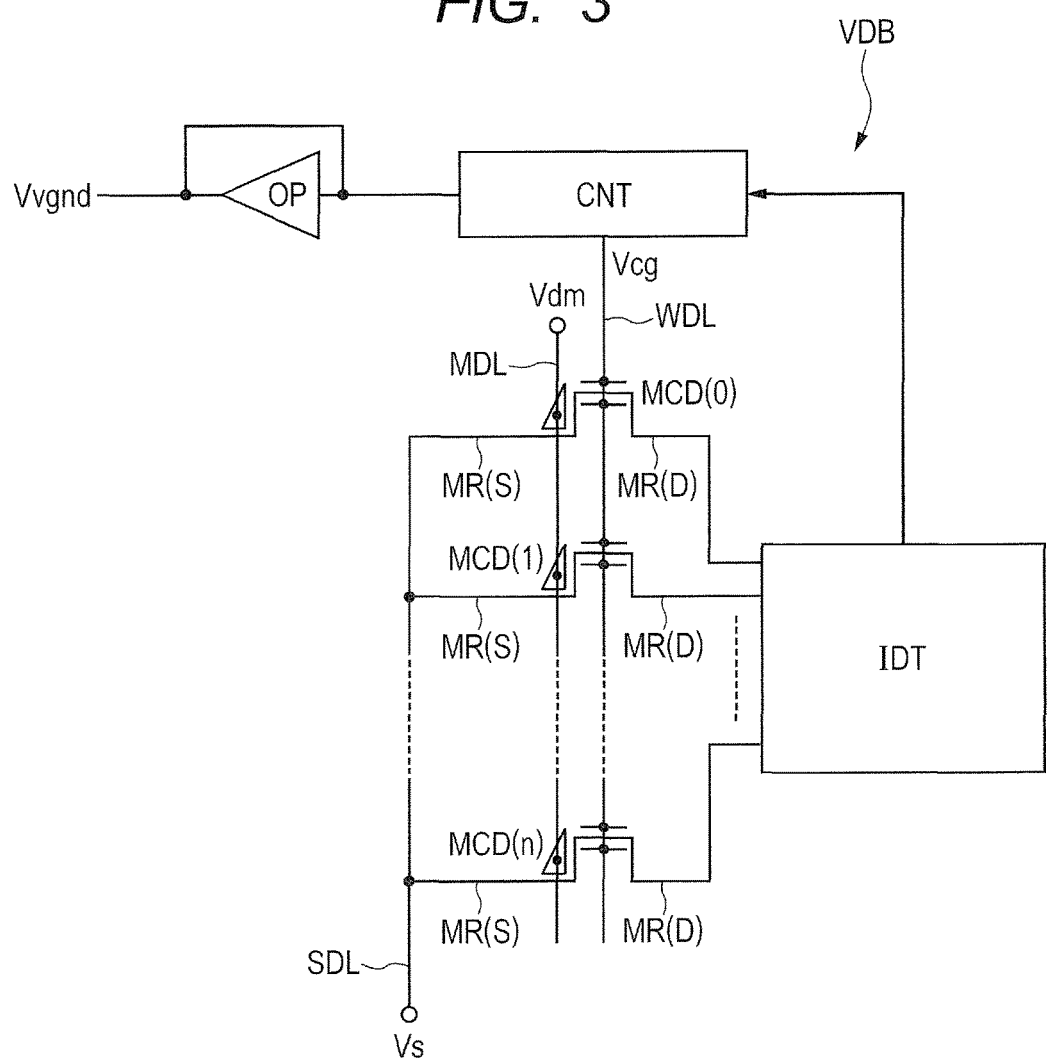
FIG. 3 is a circuit diagram showing a configuration of a threshold voltage determination circuit according to Embodiment 1.

FIG. 3 is a circuit diagram showing a configuration of the threshold voltage determination circuit VDB according to Embodiment 1. The threshold voltage determination circuit VDB includes a plurality of determination memory cells MCD(0) to MCD(n), a current detection circuit IDT, a control circuit CNT, and an arithmetic amplification circuit OP. Each of the determination memory cells MCD(0) to MCD(n) has the same structure as that of the memory cell MC described above. That is, similarly to the memory cell MC, each of the determination memory cells MCD(0) to MCD(n) includes an opposed-gate selection gate electrode, an opposed-gate memory gate electrode, a drain region, and a source region. Similarly to the memory cell MC, the determination memory cell also has a configuration in which the selection transistor STr corresponding to the opposed-gate selection gate electrode and the memory transistor MTr corresponding to the opposed-gate memory gate electrode are coupled in series to each other. In this case, each of the selection transistor STr and the memory transistor MTr is formed of a FinFET.

The source region MR(S) of each of the determination memory cells MCD(0) to MCD(n) is coupled to a determination source line SDL, the memory gate electrode MG (see FIG. 17) thereof is coupled to a determination memory gate line MDL, and the selection gate electrode SG (see FIG. 17) thereof is coupled to a determination word line WDL. The drain region MR(D) of each of the determination memory cells MCD(0) to MCD(n) is coupled to the current detection circuit IDT.

The current determination circuit IDT provides the sum of determination currents flowing in the determination memory cells MCD(0) to MCD(n) and determines whether or not the sum is smaller than a predetermined value. Since the sum of the respective determination currents flowing in the determination memory cells MCD(0) to MCD(n) is provided, the determination memory cells MCD(0) to MCD(n) can be regarded to be coupled in parallel between the determination source line SDL and the current determination circuit IDT.

To the determination source line SEL, the ground voltage Vs is supplied. To the determination memory gate line MDL, a voltage Vdm which brings the memory transistor MTr of each of the determination memory cells MCD(0) to MCD(n) into a completely ON state is supplied.

The control circuit CNT forms the gate voltage Vcg having a predetermined potential relative to the ground voltage Vs and supplies the gate voltage Vcg to the determination word line WDL. The control circuit CNT controls the value of the gate voltage Vcg to be formed on the basis of the determination result from the current determination circuit IDT. That is, the control circuit CNT gradually reduces the potential of the gate voltage Vcg until the current determination circuit IDT notifies the control circuit CT that the sum of the determination currents flowing in the determination memory cells is smaller than a predetermined value as the determination result. When the determination result shows that the sum of the currents flowing in the memory cells is smaller than the predetermined value, the control circuit CNT holds the value of the gate voltage Vcg formed thereby at that time.

The control circuit CNT also supplies the gate voltage Vcg formed thereby to a voltage follower formed of the arithmetic amplification circuit OP having an input and an output which are coupled to the control circuit CNT. The voltage follower supplies the voltage Vcg supplied thereto as a virtual reference potential Vvgnd to the power supply circuit PWC1.

The threshold voltage determination circuit VDB monitors the determination currents flowing in the determination cells each having the same structure as that of the memory cell MC to determine the threshold voltage of the selection transistor STr included in the memory cell MC. In this case, the threshold voltage determination circuit VDB can be regarded to include the determination memory cells and the determination circuit. When the threshold voltage determination circuit VDB is thus regarded, it follows that the determination circuit includes the control circuit CNT and the current determination circuit IDT each described above. The determination circuit determines the threshold voltage of the selection transistor on the basis of the respective currents flowing in the determination memory cells MCD(0) to MCD(n) and voltages in the selection gate electrodes of the selection transistors of the determination memory cells.

To determine the threshold voltage, the plurality of determination memory cells are preferably coupled in parallel to each other. However, even when the determination memory cell MCD(0) is used alone, the threshold voltage of the selection transistor STr can be determined. To describe the principle, first, the case where the determination memory cell MCD(0) is used alone is used herein as an example.

By supplying a sufficiently high voltage to the memory gate electrode MG of the determination memory cell MCD(0) to bring the memory transistor MTr into a completely ON state, it is possible to obtain the threshold voltage of the selection transistor STr included in the determination memory cell (0). The threshold voltage of the selection transistor STr can be defined as the gate voltage Vcg when a channel surface potential $\varphi_s$ corresponding to the selection gate electrode SG is in the state in the expression (2).

$$\varphi_s = 2\varphi_F \quad (2)$$

Practically, the threshold voltage of the selection transistor STr may also be defined as the gate voltage Vcg in the state where, e.g., the current Id shown in the expression (3) in relation to an ON current Ion flows in the determination memory cell MCD(0). The ON current Ion is a current which flows in the determination memory cell when the selection transistor STr is brought into the ON state $$Id = Ion/100000 \quad (3)$$

Since the expression (3) corresponds to the case where the current which flows when the selection transistors of all the memory cells are in the OFF state while the 1 k-bit memory cells MC (1024 memory cells MC) are coupled to one word line is not more than 1% of the ON current Ion, the current Id shown in the expression (3) can be regarded as a practically sufficiently low leakage current. Therefore, the gate voltage Vcg when the current Id flows in the determination memory cell can be used as the threshold voltage of the selection transistors STr. For example, when ON current Ion=10 µA/bit (memory cell) is satisfied, the determination current when the threshold voltage of the selection transistor STr is determined corresponds to 0.1 nA/bit.

When the gate voltage Vcg formed by the control circuit CNT is gradually reduced, the current determination circuit IDT determines whether or not the current flowing in the determination memory cell MCD(0) is equal to or smaller than 0.1 nA. When it is determined that the current flowing in the determination memory cell MCD(0) is equal to or smaller than 0.1 nA, on the basis of the determination result from the current determination circuit IDT, the control circuit CNT holds the gate voltage Vcg at that time. As a result, the virtual reference potential Vvgnd having a voltage equivalent to the threshold voltage of the selection transistor STr is supplied to the power supply circuit PWC1.

In the threshold voltage determination circuit VDB shown in FIG. 3, on the basis of whether or not the sum of the currents flowing in the plurality of determination memory cells is equal to or smaller than the determination current, the threshold voltage of the selection transistor STr is determined. This allows the threshold voltage to be more precisely determined.

In the configuration described using FIG. 3, the threshold voltage determination circuit VDB is provided with the determination memory cells, but the determination memory cells are not limited thereto. For example, the memory cells included in the memory array MARY may also be used as the determination memory cells. In this case, e.g., the plurality of memory cells coupled to one of the word lines can be used as the determination memory cells.

In Embodiment 1, the power supply circuit PWC1 determines the power supply voltage Vww1 supplied to the word line driver circuit WDRV using the virtual reference potential Vvgnd determined by the threshold voltage determination circuit VDB.

<Operation of Nonvolatile Memory Module Using Fin-FETs>

Next, the operation of the nonvolatile memory module NMM according to Embodiment 1 shown in FIG. 1 will be described. FIGS. 4A to 4D are views showing bias voltages for the nonvolatile memory module according to Embodiment 1. FIGS. 4A to 4D show the bias voltages when the memory cell MC(11) is the selected memory cell and the other memory cells are the non-selected memory cells, similarly to FIG. 20. That is, the word line W1 serves as the selected word line, the word lines W0, W2, and W3 serve as the non-selected word lines, the bit line B1 serves as the selected bit line, and the bit lines B0 and B2 serve as the non-selected bit lines. At this time, the memory gate line M1 serves as the selected memory gate line, the memory gate lines M0, M2, and M3 serve as the non-selected memory gate lines, the source line S1 serves as the selected source line, and the source lines S0 and S2 serve as the non-selected source lines.

FIG. 4A shows the voltage VBL in the bit line B1 coupled to the selected memory cell MC(11), the voltage VWL in the word line W1 coupled thereto, the voltage VMG in the memory gate line M1 coupled thereto, and the voltage VSL in the source line S1 coupled thereto. FIG. 4B shows the voltage VBL in the bit line B0 coupled to the non-selected memory cell MC(10), the voltage VWL in the word line W1 coupled thereto, the voltage VMG in the memory gate line M1 coupled thereto, and the voltage VSL in the source line S1 coupled thereto. FIG. 4C shows the voltage VBL in the bit line B1 coupled to the non-selected memory cell MC(01), the voltage VWL in the word line W0 coupled thereto, the voltage VMG in the memory gate line M0 coupled thereto, and the voltage VSL in the source line S0 coupled thereto. FIG. 4D shows the voltage VBL in the bit line B1 coupled to the non-selected memory cell MC(21), the voltage VWL in the word line W2 coupled thereto, the voltage VMG in the memory gate line M2 coupled thereto, and the voltage VSL in the source line S1 coupled thereto. In FIGS. 4A to 4D, VB denotes a substrate bias voltage supplied to the semiconductor region SUB1.

In FIGS. 4A to 4D, "Erase" shows the bias voltages when an erase operation is performed to the selected memory cell MC(11), "Write" shows the bias voltages when a write operation is performed to the selected memory cell MC(11), and "Read" shows the bias voltages when a read operation is performed to the selected memory cell MC(11). For example, when the erase operation is performed to the selected memory cell MC(11), the bias voltages shown by "Erase" in FIG. 4A are supplied to the selected memory cell MC(11). At this time, to the non-selected memory cells MC(10), MC(01), and MC(21), the bias voltages shown by "Erase" in FIGS. 4B, 4C, and 4D are supplied.

Likewise, when the write operation is performed to the selected memory cell MC(11), the bias voltages shown by "Write" in FIG. 4A are applied to the selected memory cell MC(11). At this time, to the non-selected memory cells MC(10), MC(01), and MC(21), the bias voltages shown by "Write" in FIGS. 4B to 4D are supplied. When the read operation is performed to the selected memory cell MC(11), to the selected memory cell MC(11), the bias voltages shown by "Read" in FIG. 4A are supplied while, to the non-selected memory cells MC(10), MC(01), and MC(21), the bias voltages shown by "Read" in FIGS. 4B to 4D are supplied.

It follows that the non-selected memory cell MC(10) and the selected memory cell MC(11) share the word line, the source line, and the memory gate line. Also, the non-selected memory cell MC(01) and the selected memory cell MC(11) share the bit line, and the non-selected memory cell MC(21) and the selected memory cell MC(11) share the source line.

In Embodiment 1, the power supply circuit PWC1 forms the power supply voltage Vww1 to be supplied to the word line driver circuit WDRV as a voltage based on the virtual reference potential Vvgnd supplied from the threshold voltage determination circuit VDB and outputs the power supply voltage Vww1. On the other hand, the power supply circuit PWC1 supplies the same voltages as those described using FIGS. 18 to 20D as the power supply voltage Vbt to be supplied to the bit line decoder/driver circuit BDEC/DRV, the power supply voltage Vss to be supplied to the source line driver circuit SDRV, the power supply voltage Vmm to be supplied to the memory gate line driver circuit MDRV, the power supply voltage Vb1 to be supplied to the substrate driver circuit SBDRV1, and the power supply voltage Vb2 to be supplied to the substrate driver circuit SBDRV2, though the power supply voltages to be supplied thereto are not particularly limited. The power supply circuit PWC1 supplies a voltage having the same voltage value as that of the power supply voltage Vb2 as the power supply voltage Vb3 to the substrate driver circuit SBDRV3, though the power supply voltage to be supplied thereto is not particularly limited. The ground voltage Vs output from the power supply circuit PWC1 is the same as the ground voltage described using FIGS. 18 to 20, which is 0 V as shown in, e.g., FIG. 19B.

The voltages supplied in FIG. 1 to the bit line decoder/driver circuit BDEC/DRV, the source line driver circuit SDRV, the memory gate line driver circuit MDRV, and the substrate driver circuit SBDRV1 are the same as the voltages supplied to the individual driver circuits shown in FIG. 18.

Accordingly, the voltage VBL in the bit line, the voltage VMG in the memory gate line, the voltage VSL in the source line, and the voltage VB in the substrate SUB1 which are shown in FIGS. 4A to 4D are the same as the voltages shown in FIGS. 19A and 19B and 20A to 20D. By contrast, the voltage VWL in the word line does not have the ground potential Vs, but has a potential based on the virtual reference potential Vvgnd. Specifically, the voltage VWL in the word line does not have a potential based on 0 V, but has the potential based on the virtual reference potential Vvgnd.

That is, the word line driver circuit WDRV supplies a voltage obtained by adding the virtual reference potential Vvgnd to the voltage VWL in the word line of each of FIGS. 19A and 19B and 20A to 20D to the word line. Specifically, the word line driver circuit WDRV shown in FIG. 1 supplies voltages obtained by adding the virtual reference potential Vvgnd to the voltages Vcge, Vcgp, and Vc and the ground voltage Vs, which are shown in FIGS. 19A and 19B and 20A to 20D, to the word line.

For example, during the erase operation, the word line driver circuit WDRV supplies a voltage (Vvgnd+Vcge) corresponding to the sum of the voltage Vcge and the virtual reference potential Vvgnd as a word line selection voltage to the selected word line and supplies a voltage (Vvgnd+Vs) corresponding to the sum of the ground voltage Vs and the virtual reference potential Vvgnd as a word line non-selection voltage to the non-selected word lines. In this case, the ground voltage Vs is 0 V so that the word line non-selection voltage supplied to the non-selected word lines has the virtual reference potential Vvgnd.

During the write operation, the word line driver circuit WDRV supplies a voltage (Vvgnd+Vcgp) corresponding to the sum of the voltage Vcgp and the virtual reference potential Vvgnd as the word line selection voltage to the selected word line and supplies the voltage (Vvgnd+Vs) corresponding to the sum of the ground voltage Vs and the virtual reference potential Vvgnd as the word line non-selection voltage to the non-selected word lines. In this case also, the ground voltage Vs is 0 V so that the word line non-selection voltage has the virtual reference potential Vvgnd.

During the read operation, the word line driver circuit WDRV supplies a voltage (Vvgnd+Vc) corresponding to the sum of the voltage Vc and the virtual reference potential Vvgnd as the word line selection voltage to the selected word line and supplies the voltage (Vvgnd+Vs) corresponding to the sum of the ground voltage Vs and the virtual reference potential Vvgnd as the word line non-selection voltage to the non-selected word lines. In this case also, the ground voltage Vs is 0 V so that the word line non-selection voltage supplied to the non-selected word line has the virtual reference potential Vvgnd.

Thus, when the memory cell MC(11) serves as the selected memory cell, the respective voltages in the word lines coupled to the selected memory cell MC(11) and the non-selected memory cells MC(10), MC(O1), and MC(21) have values as shown in FIG. 4.

The virtual reference potential Vvgnd has a value dependent on a process in which the FinFETs forming the selection transistors STr are formed or the like. However, since each of the semiconductor regions CHR interposed between the selection gate electrodes SG(GL) and SG(GR) shown in FIG. 2 is thin and the number of impurity ions (impurity concentration) in this semiconductor region is small, the virtual reference potential Vvgnd as the threshold voltage of the selection transistor STr has a negative voltage value such as, e.g., −0.5 V. In the following description, for easier understanding thereof, the virtual reference potential Vvgnd is assumed to have a negative voltage value.

<<Read Operation>>

FIG. 5 is a waveform chart showing waveforms during a read operation according to Embodiment 1. FIG. 5 shows the waveforms when information is read from the memory cell MC(11) serving as the selected memory cell. During the read operation, the respective bias voltages supplied to the selected memory cell MC(11) and the non-selected memory cells have values shown by "Read" in FIGS. 4A to 4D. Next, using FIGS. 1, 4A to 4D, and 5, the read operation will be described.

In FIG. 5, the abscissa axis shows time. The ordinate axis shows the respective voltages in the word lines W1, W0, W2, and W3, the memory gate lines M0 to M3, the bit line B1, and the source lines S0 to S2. Of the respective waveforms in the word lines W1, W0, W2, and W3, the parts located above the ground voltage Vs show positive voltages and the parts located below the ground voltage Vs show negative voltages.

At a time t0, the voltage VWL in each of the word lines W0 to W3 changes from the ground voltage Vs to the virtual reference potential Vvgnd (negative voltage) to start the read operation. Since the voltage VSL in each of the source lines S0 to S2 becomes the ground voltage Vs and the voltage VMG in each of the memory gate lines M0 to M3 becomes the ground voltage Vs, in each of the memory cells MC(00) to MC(32), the memory transistor MTr is brought into the ON state or the OFF state depending on the charges stored in the charge storage layer. Next, at a time t1, the voltage VBL in the selected bit line B1 changes from the ground voltage Vs to the voltage Vc. Then, at a time T2, the voltage VWL in the selected word line W1 rises from the virtual reference potential Vvgnd to the voltage (Vvgnd+Vc) as the word line selection voltage. At this time, the voltage VWL in each of the non-selected word lines W0, W2, and W3 retains the virtual reference potential Vvgnd as the word line non-selection voltage.

Since the voltage VWL in the selected word line W1 rises to the word line selection voltage (Vvgnd+Vc), in each of the memory cells MC(10), MC(11), and MC(12) coupled to the selected word line W1, the selection transistor STr is brought into the ON state. As a result, when the memory transistor MTr included in the selected memory cell MC(11) is in the ON state in accordance with information held as charges, the voltage VBL in the selected bit line B1 drops. When the memory transistor MTr is in the OFF state in accordance with the information held as charges, the voltage VBL in the selected bit line B1 substantially does not drop and is retained. Accordingly, by determining the voltage in the selected bit line B1, the information held in the selected memory cell MC(11) is read.

At this time, in, e.g., the non-selected memory cell MC(21) sharing the bit line B1 and the source line S1 with the selected memory cell MC(11) also, the same bias voltages as supplied to the selected memory cell are supplied to the source region and the drain region. However, to the selection gate electrode SG of the selection transistor STr included in the non-selected memory cell MC(21), the virtual reference potential Vvgnd as a negative word non-selection voltage lower than the ground voltage Vs is supplied via the non-selected word line W2. That is, the virtual reference potential Vvgnd as the voltage lower than the ground voltage Vs shown by "Read" in FIG. 20D is supplied to the non-selected word line of the non-selected memory cell MC(21). As a result, in the nonvolatile memory module NMM according to Embodiment 1, it is possible to prevent a large leakage current from flowing from the non-selected memory cell MC(21) to the selected bit line B1 and prevent erroneous information from being read during the read operation.

After the time t2, the voltage VWL in the selected word line W1 changes to the virtual reference potential Vvgnd and the voltage VBL in the bit line B1 changes to the voltage Vs. At a time t3, the read operation is ended.

<<Erase Operation>>

Figure 6:
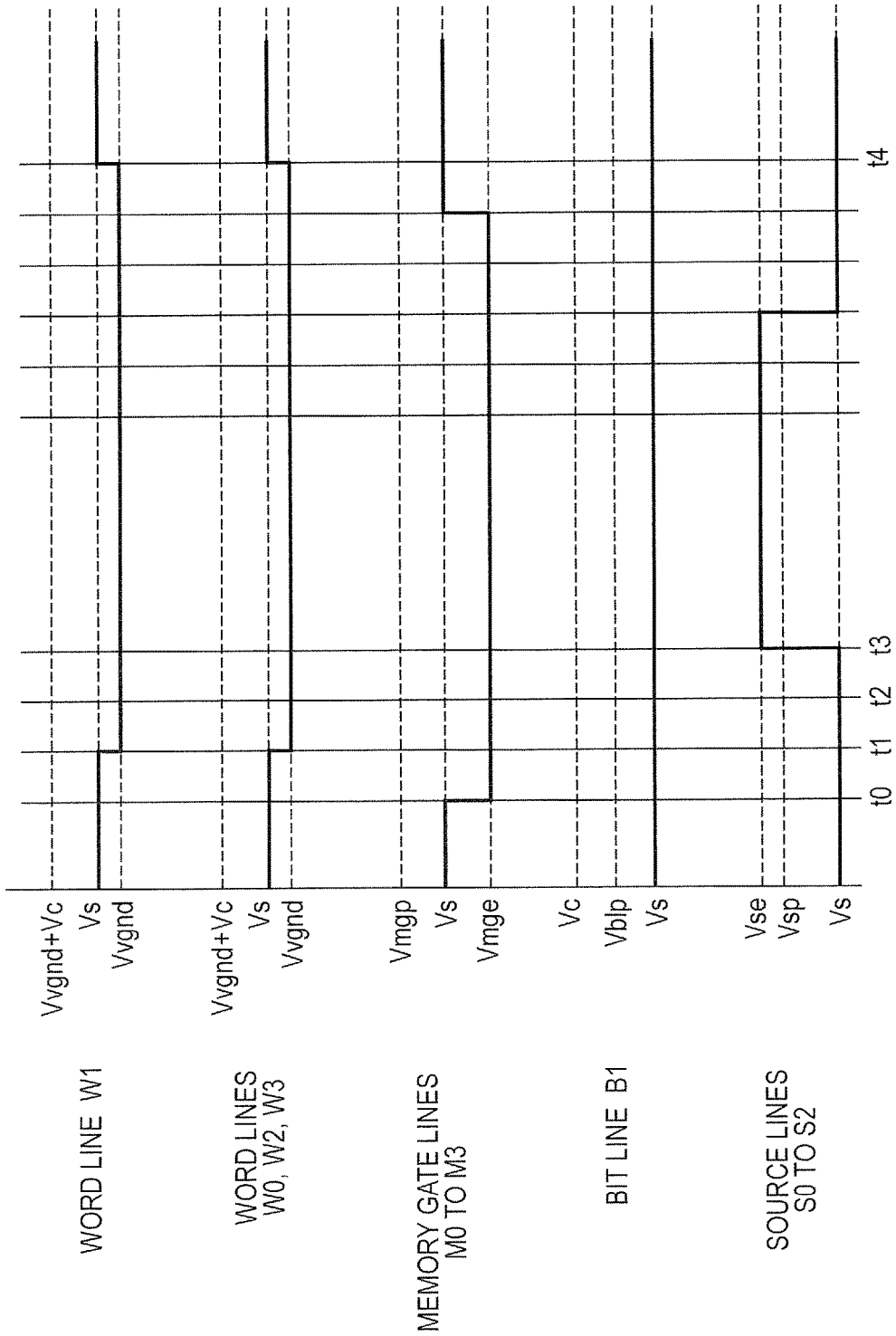
FIG. 6 is a waveform chart showing an erase operation according to Embodiment 1.

FIG. 6 is a waveform chart showing waveforms during an erase operation according to Embodiment 1. FIG. 6 shows the waveforms during the erase operation to the memory cell MC(11). In FIG. 6 also, the abscissa axis shows time and the ordinate axis shows the respective voltages of the waveforms. In the same manner as in FIG. 5, in FIG. 6 also, the parts located above the ground voltage Vs show positive voltages and the parts located below the ground voltage Vs show negative voltages. The bias voltages supplied to the selected memory cell MC(11) and the non-selected memory cells during the erase operation have the values shown by "Erase" in FIG. 4A to 4D. Next, the erase operation will be described using FIGS. 1, 4A to 4D, and 6.

In FIG. 4A to 4D, the word line selection voltage supplied to the selected word line is shown as the voltage (Vvgnd+ Vcge). However, the word line driver circuit WDRV sets the voltage Vcge to 0 V to set the word line selection voltage to the virtual reference potential Dvgnd and supplies the virtual reference potential Vvgnd as the word line selection voltage to the selected word line W1. The word line driver circuit WDRV also supplies the virtual reference potential Vvgnd as the word line non-selection voltage to the non-selected word lines W0, W2, and W3.

In FIG. 6, at the time t0, by changing the voltage VMG in each of the memory gate lines M0 to M3 from the ground voltage Vs to the negative voltage Vmge, the erase operation is started. Next, at the time t1, the voltage VWL in each of the word line W1 and the word lines W0, W2, and W3 is changed from the ground voltage Vs to the negative virtual reference potential Vvgnd. Then, at the time t3, the voltage VSL in each of the source lines S0 to S2 is changed from the ground voltage Vs to the voltage Vse as a positive erase voltage.

At the time t1, the voltage VWL in the selected word line W1 changes to the virtual reference potential Vvgnd as a negative voltage. Consequently, even when the selection transistor STr formed of the FinFET in the memory cell MC(11) has a negative threshold voltage, it is possible to reliably bring the selection transistor STr into the OFF state. This can reduce the leakage current flowing in the memory cell MC(11) and inhibit the respective voltages VBL and VSL in the bit line B1 and the source line S1 which are coupled to the memory cell MC(11) from dropping. That is, it is possible to inhibit the erase voltages supplied to the bit line and the source line from dropping and retain the erase voltages. Since the substrate bias voltage VB is the ground voltage Vs as shown in FIG. 4A, the voltage VWL in the selected word line W1 becomes a negative voltage (virtual reference potential Vvgnd) relative to the voltage in the semiconductor region SUB1. As a result, the holes generated by the phenomenon of band-to-band tunneling in the end portion of the source region of the memory cell MC(11) are further accelerated to be able to be more efficiently injected into the charge storage layer.

According to the bias voltages during the erase operation shown in FIG. 19B, the voltage VWL in the selected word line is 0 V. Accordingly, when the selection transistor STr is formed of the FinFET, it is conceivable that a large leakage current flows in the memory cell to make it difficult to retain the erase voltages, resulting in an increase in, e.g., the erase time required for the erase operation.

Note that, at the time t3, the voltage VBL in the bit line B1 may also be changed from the ground voltage Vs to a voltage Vblp between the ground voltage Vs and the voltage Vc. This allows the selection transistor STr of the memory cell MC(11) to be brought into the stable OFF state, can reduce the leakage current flowing in the selection transistor STr, and reduce power consumption during the erase operation. In this case, the voltage VBL in the bit line B1 may be returned appropriately to the ground voltage Vs after, e.g., the voltage VSL in each of the source lines S0 to S2 is changed to the ground voltage Vs.

At the time t3 and thereafter, the respective voltages in the source lines S0 to S2, the bit line B1, the memory gate lines M0 to M3, and the word lines change in succession, though the times when the voltages change are not limited, and the erase operation is ended at a time t4.

Note that the description has been given heretofore by using the erase operation to the selected memory cell MC(11) as an example. However, the use of the bias voltages during the erase operation shown in FIGS. 4A to 4D also allows a simultaneous and collective erase operation to be performed to the plurality of memory cells including the non-selected memory cells MC(10), MC(01), and MC(21).

<<Write Operation>>

FIG. 7 is a waveform chart showing waveforms during a write operation according to Embodiment 1. FIG. 7 shows the waveforms during the write operation to the memory cell MC(11). In FIG. 7 also, the abscissa axis shows time and the ordinate axis shows the respective voltages of the waveforms. In the same manner as in FIG. 5, in FIG. 7 also, the parts located above the ground voltage Vs show positive voltages and the parts located below the ground voltage Vs show negative voltages. The bias voltages supplied to the selected memory cell MC(11) and the non-selected memory cells during the write operation have the values shown by "Write" in FIG. 4. Next, the write operation will be described using FIGS. 1, 4A to 4D, and 7.

In FIG. 4A to 4D, the word line selection voltage supplied to the selected word line is shown as the voltage (Vvgnd+ Vcgp). However, the word line driver circuit WDRV sets the voltage Vcgp to the voltage Vc to set the word line selection voltage to the voltage (Vvgnd+Vc) corresponding to the sum of the virtual reference potential Vvgnd and the voltage Vc and supplies the voltage (Vvgnd+Vc) as the word line selection voltage to the selected word line W1. The word line driver circuit WDRV also supplies the virtual reference potential Vvgnd as the word line non-selection voltage to the non-selected word lines W0, W2, and W3.

In FIG. 7, at the time t0, the voltage VWL in each of the word lines W1 and the word lines W0, W2, and W3 changes from the ground voltage Vs to the virtual reference potential Vvgnd to start the write operation. Next, at the time t1, the voltage VSL in each of the source lines S0 to S2 changes from the ground voltage Vs to the voltage Vsp. At the time t2, the voltage VWL in the selected word line W1 changes from the virtual reference potential Vvgnd to the voltage (Vvgnd+Vc) as the word line selection voltage, while the voltage VMG in each of the memory gate lines M0 to M3 changes from the ground voltage Vs to the voltage Vmgp. Note that FIG. 7 shows the case where, in accordance with information to be written, the voltage VBL in the selected bit line B1 has changed to the ground voltage Vs. Needless to say, when different information is to be written, the voltage VBL in the selected bit line B1 changes to, e.g., the voltage Vc.

In the selected memory cell MC(11), at the time t2, the voltage VWL in the selected word line W1 changes to the word line selection voltage (Vvgnd+Vc) to bring the selection transistor STr into a sufficient ON state. Also, at the time t2, the voltage VMG in the memory gate line M1 changes to the positive voltage Vmgp so that electrons are injected as charges into the charge storage layer of the memory transistor MTr and information is written as the charges.

At this time, in each of the non-selected memory cells which shares the bit line B1 or/and the source line S1 with the selected memory cell MC(11), the negative virtual reference potential Vvgnd is supplied as the word line non-selection voltage to the selection gate electrode of the selection transistor STr via the non-selected word line. As a result, even when the selection transistor STr is formed of the FinFET, it is possible to bring the selection transistor of the non-selected memory cell into the OFF state and prevent a large leakage current from flowing in the selection transistor of the non-selected memory cell. This can reduce the occurrence of the injection of charges due to a leakage current into the charge storage layer of the non-selected memory cell and allow a disturb to be avoided.

It is particularly concerned that, in the non-selected memory cell MC(21) sharing the source line S1 with the selected memory cell MC(11), a large leakage current flows in the selection transistor STr. However, since the negative word line non-selection voltage serves as the voltage VWL in the non-selected word line W2, the selection transistor STr is brought into the OFF state and consequently a disturb can be avoided. For example, when the bias voltages shown in FIGS. 20A to 20D are used, while the write operation is performed to the selected memory cell MC(11), the ground voltage Vs is supplied to the word line W2 coupled to the non-selected memory cell MC(21) and supplied also to the bit line B1 coupled thereto. When the selection transistor STr is formed of the FinFET, the threshold voltage is a negative voltage so that the selection transistor STr in the non-selected memory cell MC(21) is brought into the ON state and a large leakage current flows in the selection transistor STr.

At the time t2 and thereafter, the respective voltages in the memory gate lines M0 to M3, the selected word line W1, the source lines S0 to S2, and the non-selected word lines W0, W2, and W3 change in succession and, at the time t3, the write operation is ended.

<<Verify Operation>>

In the nonvolatile memory module NMM according to Embodiment 1, after the write operation and the erase operation each described above are performed, a verify operation is performed. The verify operation is a read operation which determines whether or not a write level or an erase level in the selected memory cell has reached a sufficient level in the write or erase operation. If it is determined that the write level or the erase level is insufficient in the verify operation, the write operation or the erase operation is repeatedly performed to the selected memory cell for which it is determined that the write or erase level is insufficient until the write or erase level reaches a sufficient write or erase level.

For example, in the verify operation after the write operation is performed to the selected memory cell, a read operation is performed to the selected memory cell and the voltage in the selected bit line at that time is subjected to a determination. For example, when the voltage in the selected bit line has not reached a predetermined value, the write level is determined to be insufficient and the write operation is performed again to the selected memory cell. The verify operation and the write operation each described above are repeatedly performed until the write level is determined to be sufficient. In the verify operation also, to, e.g., the non-selected memory cell sharing the bit line or/and the source line with the selected memory cell, bias voltages are supplied. That is, the verify operation causes a disturb in the non-selected memory cell. While the description has been given using the write operation as an example, in the erase operation also, the verify operation causes disturbs in the non-selected memory cells.

For example, when each of the memory cells is formed of a planar FET, by changing the substrate bias voltage supplied to the semiconductor substrate, it is possible to adjust the threshold voltage of the selection transistor STr so as to bring the selection transistor STr into the stable OFF state. However, since the write operation or the erase operation and the verify operation are alternately repeated, it is required to switch the substrate bias voltage supplied to the semiconductor substrate upon each switching between the write operation or the erase operation and the verify operation. To switch the voltage in the semiconductor substrate, a high power is required to form the substrate bias voltage, which leads to increased power consumption.

In Embodiment 1, the substrate bias voltage VB to the semiconductor region SUB1 where the memory array MARY is formed is not changed, but the virtual reference potential Vvgnd is used as the word line non-selection voltage to be supplied to the non-selected word lines. Thus, the selection transistor of each of the non-selected memory cells is brought into the OFF state to reduce leakage currents and disturbs. Accordingly, it is possible to avoid an increase in power consumption.

The ground voltage Vs and the voltages (bias voltages) Vc, Vcge, Vcgp, Vmge, Vmgp, Vse, and Vsp which are described in Embodiment 1 are not particularly limited, but have the values shown in FIGS. 19A and 19B by way of example. For example, the ground voltage Vs is 0 V, the voltage Vc is a positive voltage (1.5 V) relative to the ground voltage Vs, the voltage Vmge is a negative voltage (−5 V) relative to the ground voltage Vs, the voltage Vmgp is a positive voltage (10 V) relative to the ground voltage Vs, and each of the voltages Vse and Vsp is a positive voltage (5 V) relative to the ground voltage Vs.

The ground voltage Vc and the voltages (bias voltages) Vcge, Vcgp, Vmge, Vmgp, Vse, and Vsp which are described above may be formed respectively by the driver circuits WDRV, SDRV, MDRV, SBDRV1 to SBDRV3, and BDEC/DRV on the basis of the ground voltage Vs and the power supply voltages Vww1, Vb1 to Vb3, Vbt, Vss, and Vmm supplied from the power supply circuit PWC1 to the individual driver circuits or may also be formed by the power supply circuit PWC1.

When the power supply circuit PWC1 forms these bias voltages, the formed bias voltages may be supplied appropriately as the power supply voltages to the individual driver circuits. In this case, the individual driver circuits may appropriately supply the bias voltages supplied thereto as the power supply voltages to the corresponding lines. For example, during the erase operation, to the word line driver circuit WDRV, the word line selection voltage (Vvgnd+Vcge) and the word line non-selection voltage (Vvgnd) are supplied as the power supply voltage Vww1 from the power supply circuit PWC1. During the write operation, to the word line driver circuit WDRV, the word line selection voltage (Vvgnd+Vcgp) and the word line non-selection voltage (Vvgnd) are supplied as the power supply voltage Vww1 from the power supply circuit PWC1. During the read operation, to the word line driver circuit WDRV, the word line selection voltage (Vvgnd+Vcgp) and the word line non-selection voltage (Vvgnd) are supplied as the power supply voltage Vww1 from the power supply circuit PWC1. During each of the operations, the word line driver circuit WDRV may appropriately supply the word line selection voltage supplied as the power supply voltage Vww1 to the selected word line and supply the word line non-selection voltage to the non-selected word lines. The same applies also to the other driver circuits.

In Embodiment 1, the description has been given using the N-type FinFET as an example. However, each of the selection transistor STr and the memory transistor MTr may also be formed of a P-type FinFET. In either case, it is sufficient that the word line non-selection voltage supplied to the selection gate electrode of the selection transistor STr included in each of the non-selected memory cells brings the selection transistor STr into the OFF state. In other words, it is sufficient that the word line non-selection voltage which brings the selection transistor STr into the OFF state on the basis of the voltage in the source region MR(S) or the drain region MR(D) of the non-selected memory cell is supplied to the non-selected word lines. Alternatively, it is sufficient that the word line non-selection voltage supplied to the non-selected word lines is provided as a negative voltage or a positive voltage on the basis of the voltage in the semiconductor substrate (semiconductor region) SUB1 where the memory array MARY is formed so as to bring the selection transistor STr of each of the non-selected memory cells into the OFF state.

<Modification 1>

The bias voltages shown in FIGS. 4A to 4D show the case where a memory cell is specified from among a plurality of memory cells sharing a word line, and a write operation and a read operation are performed to the specified memory cell. That is, the case is shown in which, from among the memory cells MC(10), MC(11), and MC(12) coupled to the word line W1, the memory cell MC(11) is specified, and the write operation or the read operation is performed to the memory cell MC(11) as the selected memory cell. In this case, when the write operation or the read operation is performed to another memory cell in the memory column MCC(1) including the plurality of memory cells coupled to the same word line W1, it is necessary to sequentially specify each one of the memory cells included in the memory cell column MCC(1) as the selected memory and perform the write operation or the read operation to the specified memory cell.

In Modification 1, it is possible to simultaneously perform the write operation or the read operation to an arbitrary number of the memory cells in the memory cell column including the plurality of memory cells coupled to the same word line.

In Modification 1, the plurality of or all the bit lines specified by the bit line decoder/driver circuit BDEC/DRV by decoding a column address signal are used as the selected bit lines. During the write operation, the bit line decoder/driver circuit BDEC/DRV supplies a voltage (the ground voltage Vs or the voltage Vc) in accordance with information from the input/output circuit I/O to the selected bit lines. On the other hand, during the read operation, the bit line decoder/driver circuit BDEC/DRV supplies the voltages in the selected bit lines to the input/output circuit I/O. This allows the write operation or the read operation to be simultaneously performed to the plurality of memory cells.

FIGS. 8A to 8D are views showing bias voltages for a nonvolatile memory module according to Modification 1. FIGS. 8A to 8D show the bias voltages when the memory cells MC(10) and MC(11) included in the memory cell column MCC(1) corresponding to the word line W1 are specified as the selected memory cells. FIG. 8A shows the bias voltages to the selected memory cell MC(11), which are the same as in FIG. 4A. FIGS. 8C and 8D show the bias voltages to the non-selected memory cells MC(01) and MC(21), which are the same as in FIGS. 4C and 4D.

FIG. 8B shows the bias voltages to the selected memory cell MC(10). FIG. 8B is similar to FIG. 4B. In Modification 1, the bit line decoder/driver circuit BDEC/DRV simultaneously selects the bit lines B1 and B0. Accordingly, during the write operation in FIG. 8B, the bit lines B0 and B1 simultaneously serve as the selected bit lines and the ground voltage Vs or the voltage Vc is supplied to the selected bit lines B0 and B1 in accordance with the information to be written. As a result, in FIG. 8B also, in the same manner as in FIG. 8A, the bias voltage in the bit line B0 is the voltage (the ground voltage Vs or the voltage Vc) in accordance with the information during the write operation.

During the read operation, the bit line decoder/driver circuit BDEC/DRV simultaneously couples the bit lines B0 and B1 as the selected bit lines to the input/output circuit I/O. As a result, in Modification 1, a write operation or a read operation is performed simultaneously to the plurality of or all the memory cells included in the same memory cell column.

<Modification 2>

Figure 9:
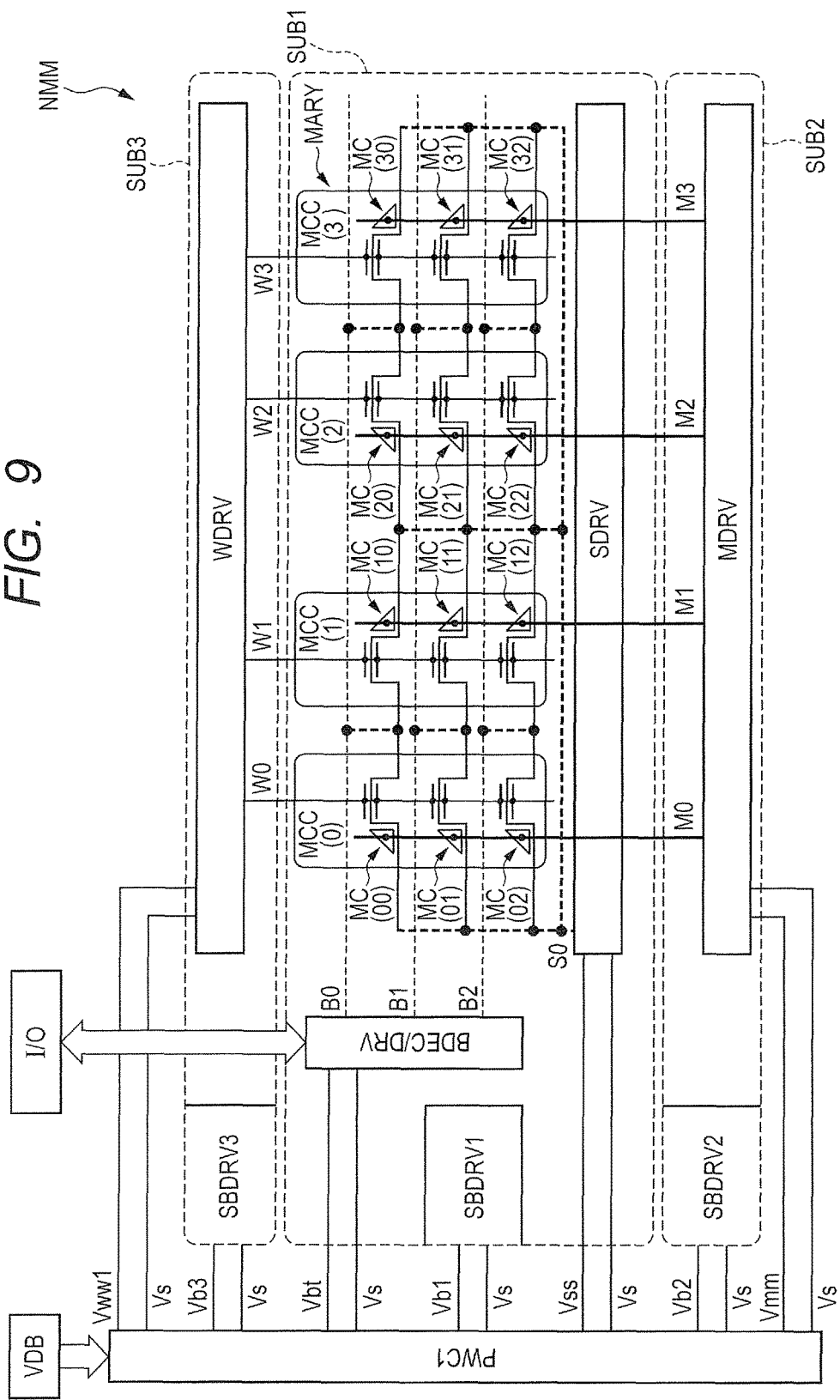
FIG. 9 is a block diagram showing a configuration of a nonvolatile memory module according to Modification 2 of Embodiment 1.

FIG. 9 is a block diagram showing a configuration of a nonvolatile memory module according to Modification 2. Since FIG. 9 is similar to FIG. 1, a description will be given mainly of the differences therebetween. In FIG. 1, the source line specified from among the plurality of source lines S0 to S2 by the column address signal is selected, and the source line driver circuit SDRV supplies the source line selection voltage to the selected source line. It follows therefore that the source line driver circuit SDRV includes respective driver circuits corresponding to the individual source lines.

By contrast, in Modification 2, the plurality of or all the source lines are integrated into one source line and, to the plurality of or all the source lines integrated into one source line, e.g., one driver circuit is coupled. Specifically, and with reference to FIG. 9, the three source lines S0 to S2 are integrated into one source line S0, and the source line driver circuit SDRV includes a driver circuit coupled to the source line S0.

In this case, a write operation, an erase operation, and a read operation are performed on a per-word-line basis. That is, the write operation, the erase operation, and the read operation are performed to the plurality of memory cells coupled to the same word line and included in one memory cell column. FIGS. 10A to 10D show bias voltages for a nonvolatile memory module according to Modification 2. FIGS. 10A to 10D show the bias voltages when the word line W1 serves as the selected word line and the memory cell MC(11) serves as the selected memory cell, similarly to FIGS. 4A to 4D.

Since the source lines S0 to S2 are integrated with each other, the voltage in the source line coupled to the respective source regions of the non-selected memory cells MC(10), MC(01), and MC(21) changes in synchronization with the voltage in the source line coupled to the selected memory cell MC(11). That is, to the respective source regions of these memory cells, the same bias voltages are supplied during the erase operation, the write operation, and the read operation.

Compared to FIG. 4C, FIG. 10C shows the write operation during which the voltage Vsp is supplied to the source region of the non-selected memory cell MC(01). However, at this time, the voltage (voltage VWL in the word line) in the selection gate electrode of the non-selected memory cell MC(1) is the virtual reference potential Vvgnd so that the selection transistor STr is brought into the OFF state. Therefore, it is possible to prevent the write operation from being performed to the non-selected memory cell MC(01).

In Modification 2, the plurality of or all the source lines are integrated with each other. Accordingly, it is possible to reduce the number of the driver circuits included in the source line driver circuit SDRV and consequently reduce the area of the source line driver circuit SDRV.

<Modification 3>

FIGS. 11A to 11D show bias voltages for a nonvolatile memory module according to Modification 3 of Embodiment 1. In Modification 3, Modifications 1 and 2 described above are combined with each other. That is, as shown in FIG. 9, in the memory array MARY, the plurality of source lines S0 to S2 are integrated into one source line. In other words, the respective source regions of the plurality of the memory cells arranged in the form of a matrix are coupled commonly to the source line S0 and coupled to the source line driver circuit SDRV. On the other hand, in Modification 3, the bit line decoder/driver circuit BDEC/DRV selects the plurality of or all the bit lines in accordance with a row address signal, in the same manner as in Modification 1.

As a result, in the nonvolatile memory module NMM according to Modification 3, when one word line is selected from among the plurality of word lines, a write operation or a read operation is performed substantially simultaneously to the plurality of or all the memory cells disposed in the memory cell column (MCC(1)) coupled to the selected word line (e.g., W1).

The bias voltages shown in FIGS. 11A to 11D are similar to the bias voltages shown in FIGS. 10A to 10D. The bias voltages shown in FIGS. 11A to 11D are different from the bias voltages shown in FIGS. 10A to 10D in that the memory cell MC(10) coupled to the same word line W1 as coupled to the selected memory cell MC(11) serves as the selected memory cell and, during the write operation, the voltage VBL in the bit line B0 is the ground voltage Vs or the voltage Vc in accordance with information to be written.

In Modification 3, it is possible to simultaneously perform a read operation or a write operation to the plurality of selected memory cells.

In Embodiment 1, as the selection transistor STr included in each of the memory cells, the FinFET is used to be able to improve the operating speed (switching speed) of the memory cell. In addition, even when the threshold voltage of the selection transistor STr has a negative value, it is possible to reduce disturbs and also reduce leakage currents. This allows excellent memory characteristics to be obtained with low power consumption.

Embodiment 2

Figure 12:
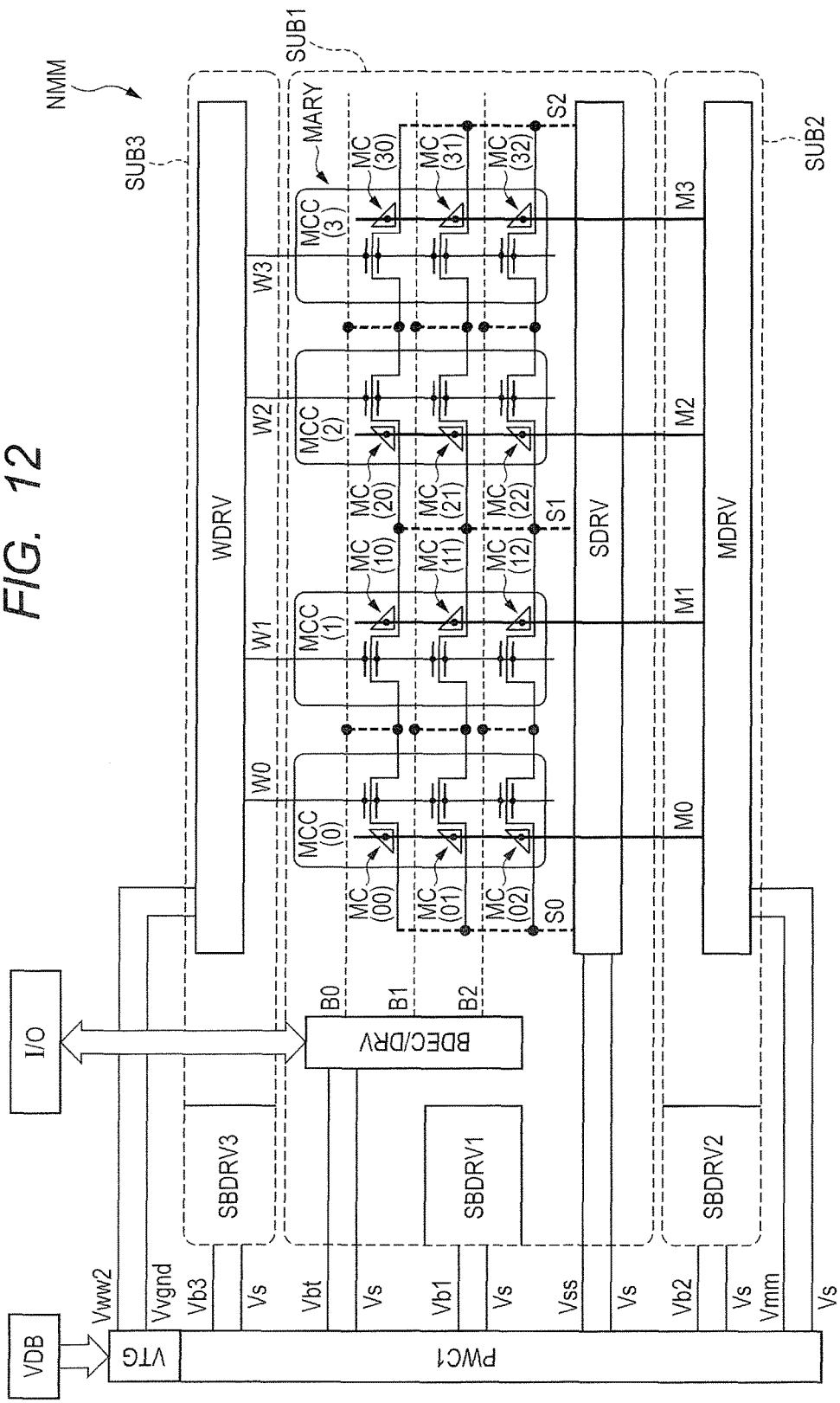
FIG. 12 is a block diagram showing a configuration of a nonvolatile memory module according to Embodiment 2.

FIG. 12 is a block diagram showing a configuration of a nonvolatile memory module according to Embodiment 2. Since FIG. 12 is similar to FIG. 1 according to Embodiment 1, a description will be given mainly of the differences between Embodiments 2 and 1. In Embodiment 1, as the word line selection voltage, the predetermined voltages Vcge, Vcg, and Vc are formed on the basis of the virtual reference potential Vvgnd and supplied to the selected word line. That is, as shown in FIG. 4A, the power supply circuit PWC1 forms the voltage corresponding to the sum of the virtual reference potential Vvgnd and each of the predetermined voltages as the voltage in the selected word line coupled to the selected memory cell MC(11). For example, the word line selection voltage during the write operation is the voltage (Vvgnd+Vcgp).

By contrast, in Embodiment 2, the predetermined voltages Vcge, Vcgp, and Vc based on the ground voltage Vs are each used as the word line selection voltage, while the virtual reference potential Vvgnd is used as the word line non-selection voltage.

In FIG. 12, VTG shows a voltage trimming circuit provided in the power supply circuit PWC1. To the voltage trimming circuit VTG, the virtual reference potential Vvgnd is supplied from the threshold voltage determination circuit VDB. The voltage trimming circuit VTG supplies the virtual reference potential Vvgnd supplied thereto as the virtual ground voltage to the word line driver circuit WDRV, though the use of the virtual reference potential Vvgnd is not particularly limited. The voltage trimming circuit VTG also supplies the predetermined voltages Vcge, Vcgp, and Vc based on the ground voltage Vs as a power supply voltage Vww2 to the word line driver circuit WDRV.

The word line driver circuit WDRV supplies the power supply voltage Vww2 as the word line selection voltage to the selected word line and supplies the virtual reference potential Vvgnd as the virtual ground voltage to the non-selected word lines.

FIGS. 13A to 13D are views showing bias voltages for a nonvolatile memory module according to Embodiment 2. Similarly to FIGS. 4A to 4D, FIGS. 13A to 13D show the respective voltages VBL in the bit lines coupled to the memory cells MC(11), MC(10), MC(01), and MC(21), the respective voltages VWL in the word lines coupled thereto, the respective voltages VMG in the memory gate lines coupled thereto, the respective voltages VSL in the source lines coupled thereto, and the substrate bias voltages VB. In FIGS. 13A to 13B also, the bias voltages when the memory cell MC(11) is used as the selected memory cell are shown. The bias voltages shown in FIG. 13A to 13D are similar to the bias voltages shown in FIGS. 4A to 4D and different therefrom in the values of the voltages VWL in the word lines which are shown in FIGS. 13A and 13B.

That is, in Embodiment 2, as shown in FIGS. 13A and 13B, the word line selectin voltage supplied to the selected word line W1 is the voltage Vcge, Vcpg, or Vc based on the ground voltage Vs. Consequently, the power supply circuit PWC1 including the voltage trimming circuit VTG need not form the word line selection voltage based on the virtual reference potential Vvgnd. This allows the power supply circuit PWC1 to be simplified. The word line selection voltage during an erase operation is the voltage Vcge based on the ground voltage Vs. The word line selection voltage during a write operation is the voltage Vcgp based on the ground potential Vs. The word line selection voltage during a read operation is the voltage Vc based on the ground voltage Vs.

A FinFET operates even in a completely depleted state. Accordingly, unlike in a planar FET, even when a negative voltage is supplied to the gate electrodes of the FinFET, a parasitic capacitance (substrate capacitance) is not generated between the gate electrodes and the semiconductor substrate in the completely depleted state, as shown in FIGS. 22A to 22C. This is because the FinFET has a structure in which the gate electrodes are not opposed to the semiconductor substrate, but are opposed to each other with a thin fin being interposed therebetween. When the voltage to the gate electrodes is changed to shift the FinFET from the ON state to the OFF state and an inversion layer no longer exists in the channel, the voltages between the gate electrodes between which the fin is interposed change in phase so that the substrate capacitance disappears. Accordingly, the FinFET is characterized in that, even when the voltage supplied to the gate electrodes is further greatly changed toward a more negative potential, the substrate capacitance is not formed.

The FinFET is also characterized in that, even when the substrate bias voltage supplied to the semiconductor substrate is changed, the threshold voltage thereof remains unchanged. Accordingly, when a FinFET is used as the selection transistor STr included in each of the memory cells, instead of supplying the substrate bias voltage, the voltage in the word line supplied to the selection gate electrode is changed toward a more negative potential. This is effective in bringing the selection transistor STr into a stable OFF state and reducing leakage currents.

In Embodiment 2, to make an effective use of the characteristic features of the FinFET described above, the effect of varying the threshold voltage due to the FinFET is applied to the lower potential region. That is, when a low-potential word line voltage (word line non-selection voltage) which brings the selection transistor STr into the OFF state is supplied to the selection gate electrode of the selection transistor STr formed of the FinFET, the virtual reference potential Vvgnd as the negative voltage is supplied. Thus, the same effect as achieved by increasing the threshold voltage of a planar FET by changing the substrate bias voltage can be obtained using the FinFET. That is, it is possible to bring the selection transistor STr into the stable OFF state in the memory cell and reduce a leakage current.

Embodiment 3

FIGS. 14A to 14D are views showing bias voltages for a nonvolatile memory module according to Embodiment 3. The bias voltages shown in FIGS. 14A to 14D are similar to the bias voltages shown in FIGS. 4A to 4D. Since the bias voltages for the non-selected memory cell MC(10) shown in FIG. 14B are the same as the bias voltages shown in FIG. 4B, a description thereof is omitted. On the other hand, the difference between FIGS. 14A, 14C, and 14D and FIGS. 4A, 4C, and 4D is the voltage VBL in the bit line during a write operation. That is, in Embodiment 3, the voltage in the selected bit line B1 is the voltage Vc or a voltage Vblp in accordance with information to be written. The voltage Vblp has a value between the ground voltage Vs and the voltage Vc.

Figure 15:
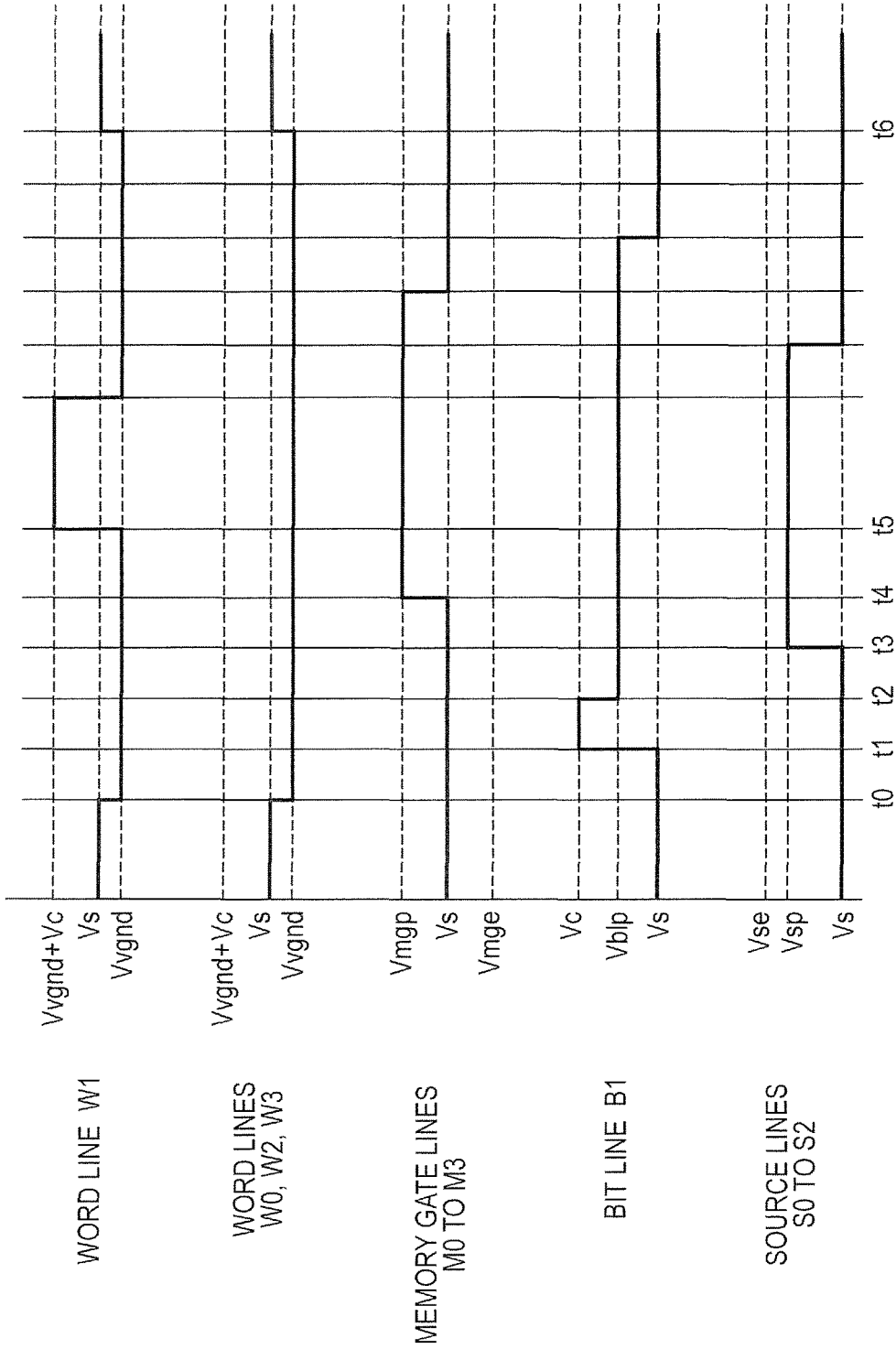
FIG. 15 is a waveform chart showing a write operation according to Embodiment 3.

FIG. 15 is a waveform chart showing the write operation to the selected memory cell MC(11) according to Embodiment 3. In FIG. 15, the abscissa axis shows time and the ordinate axis shows the respective voltages of the waveforms. Next, using FIGS. 14A to 14D and 15, operations in Embodiment 3 will be described. It is assumed that the nonvolatile memory module NMM according to Embodiment 3 has the configuration shown in FIG. 1, though the configuration of the nonvolatile memory module NMM according to Embodiment 3 is not particularly limited.

In Embodiment 3, when the write operation is performed to the selected memory cell MC(11), the voltage VBL in the selected bit line B1 is not the ground voltage Vs, but the voltage Vblp between the voltages Vc and Vs.

First, at the time t0, the write operation is started. At the time t1, the voltage VBL in the selected bit line B1 rises to the voltage Vc. At the time t2, the voltage VBL in the selected bit line B1 drops toward the voltage Vs to become the voltage Vblp. Next, at the time t3, the voltage VSL in the source line S1 rises to the voltage Vsp and, at the time t4, the voltage VMG in the memory gate line M1 rises to the voltage Vmgp. Then, at a time t5, the voltage VWL in the selected word line W1 rises to the voltage (Vvgnd+Vc). The voltage VBL in the selected bit line B1 has dropped from the voltage Vc to the voltage Vblp, but has not dropped to the ground voltage Vs. Accordingly, during the write operation, it is possible to reduce the current flowing in the selected memory cell MC(11). That is, in Embodiment 3, it is possible to reduce the current consumed during the write operation.

Needless to say, when the write operation is performed to the selected memory cell MC(11), to the non-selected word lines W0, W2, and W3, the virtual reference potential Vvgnd is supplied as the word line non-selection voltage. Accordingly, it is possible to reduce the leakage current in each of the non-selected memory cells MC(01), MC(21), and the like and further reduce power consumption.

As a result, it is possible to, e.g., reduce the current supplying ability required of the power supply circuit PWC1 and reduce the size of the power supply circuit PWC1.

The write operation is not particularly limited but, at the time t5 and thereafter, the voltage VWL in the word line W1, the voltage VSL in each of the source lines S0 to S2, the voltage VMG in each of the memory gate lines M0 to M3, and the voltage VBL in the bit line B1 sequentially change as shown in FIG. 15 and, at a time t6, the write operation is ended.

In Embodiment 3, after the voltage VBL in the selected bit line B1 is raised to the voltage Vc at the time t1, the voltage VBL in the selected bit line B1 is lowered, while the current flowing in the selected bit line B1 is detected, though the control of the voltage VBL is not particularly limited thereto. By detecting the current, the time when the current flowing in the selected bit line B1 reaches a predetermined value is determined to be the time t2, and the voltage VBL in the selected bit line B1 at that time is the voltage Vblp described above. By thus determining whether or not the flowing current has reached the predetermined value, the voltage VBL in the selected bit line B1 can easily be set to the voltage Vblp.

Embodiment 4

In Embodiment 4, during a write operation or/and an erase operation, the voltage VSL in each of the source lines S0 to S2 changes pulsewise. To obtain the voltage VSL which changes pulsewise, the power supply circuit PWC1 may form the source line selection voltage which changes pulsewise or the source line driver circuit SDRV may cause the source line selection voltage to change pulsewise.

Figure 16:
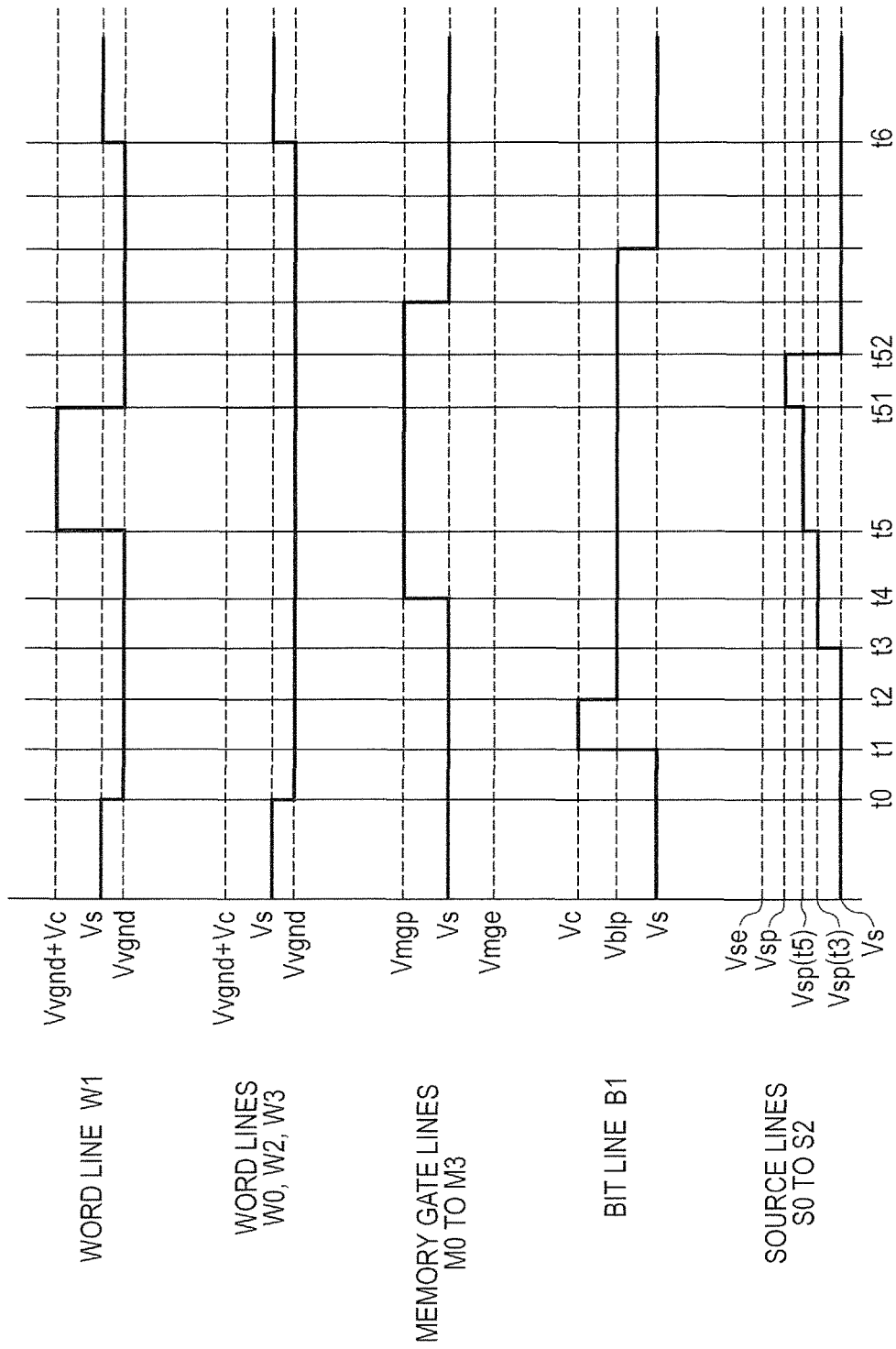
FIG. 16 is a waveform chart showing a write operation according to Embodiment 4.

FIG. 16 is a waveform chart showing a write operation to the selected memory cell MC(11) according to Embodiment 4. Since FIG. 16 is similar to FIG. 15, a description will be given mainly of the differences therebetween. In FIG. 15, after the voltage VSL in each of the source lines S0 to S2 rises to the voltage Vsp at the time t3, the voltage VSL is held at a given value and then drops to the voltage Vs. By contrast, in FIG. 16, the voltage VSL in each of the source lines S0 to S2 rises from the voltage Vs to the voltage Vsp (t3) at the time t3 and then rises from the voltage Vsp (t3) to the voltage Vsp (t5) at the time t5. Then, at a time t51, the voltage VSL in each of the source lines S0 to S2 rises to the voltage Vsp and then drops to the voltage Vs at a time T52. The voltage Vsp (t3) has a voltage value between the voltage Vs and the voltage Vsp, while the voltage Vsp (t5) has a voltage value between the voltage Vsp (t3) and the voltage Vsp. That is, the voltage in each of the source lines S0 to S2 changes pulsewise during the write operation. Accordingly, the voltage VSL in each of the source lines rises stepwise a plurality of times to reach the voltage Vsp. As a result, it is possible to, e.g., suppress a variation in the bias voltage supplied to the selected memory cell MC(11) and suppress the degradation of the memory characteristics.

The description has been given heretofore using the write operation as an example. However, in an erase operation also, it is possible to suppress the degradation of the memory characteristics by similarly pulsewise changing the voltage in each of the source lines. Also, the description has been given using the source lines as an example, but is not limited thereto.

In Embodiment 4 also, the word line non-selection voltage supplied to the non-selected word line is the virtual reference potential Vvgnd. This can reduce disturbs and power consumption.

In each of Embodiments 1 to 4, the threshold voltage of the selection transistor STr formed of the FinFET is determined using the threshold voltage determination circuit VDB. However, the determination of the threshold voltage of the selection transistor STr is not limited thereto. For example, when the threshold voltage of the selection transistor STr formed of the FinFET can be measured or expected in advance, it may also be possible to allow the power supply circuit PWC1 to form the virtual reference potential Vvgnd corresponding to the measured or expected threshold voltage. Thus, the formed virtual reference potential Vvgnd may be supplied as the word line non-selection voltage to the non-selected word lines.

Although the foregoing description has been given mainly of the case where the N-type FinFET is used as the selection transistor STr included in the memory cell, the selection transistor STr may also be formed of a P-type FinFET. In each of the embodiments, the case where the N-type FinFET has a negative threshold voltage has been described by way of example. In this case, in each of the non-selected memory cells, a potential in the selection gate electrode SG is set to a negative value relative to the potential in the source region MR(S) or the drain region MR(D) of the memory cell so as to bring the selection transistor STr into the OFF state. From another viewpoint, to bring the selection transistor STr of each of the non-selected memory cells into the OFF state, the potential in the selection gate electrode SG of the selection transistor STr of the memory cell is set to a negative value on the basis of the voltage in the semiconductor substrate (semiconductor region) SUB1 where the memory array MARY is formed.

By contrast, when a P-type FinFET is used as the selection transistor STr, to bring the selection transistor STr of each of the non-selected memory cells into the OFF state, the potential in the selection gate electrode SG is set to a positive value relative to the potential in the source region MR(S) or the drain region MR(D). From another viewpoint, the potential in the selection gate electrode SG of the selection transistor STr of the memory cell is set to a positive value on the basis of the voltage in the semiconductor substrate (semiconductor region) SUB1.

As a result, no matter which one of the N-type FinFET and the P-type FinFET is used as the selection transistor, it is possible to obtain the same effect as obtained in the state where the absolute value of the threshold voltage of the selection transistor STr is substantially increased. That is, by changing the substrate bias voltage, even when a FinFET having a threshold voltage that is hard to adjust is used as the selection transistor STr, it is possible to obtain the same effect as obtained through the adjustment of the threshold voltage using the substrate bias voltage and reliably bring the selection transistor STr of each of the non-selected memory cells into the OFF state.

In each of Embodiments 1 to 4, the memory transistor MTr included in each of the memory cells is also formed of the FinFET, but the memory transistor MTr is not limited thereto. For example, the memory transistor MTr may also have only one of the pair of memory gate electrodes opposed to each other such that the fin region is interposed therebetween. Also, each of the embodiments has described the example in which, in the memory array MARY, the bit lines extend in the row direction, while the word lines, the memory gate lines, and the source lines extend in the column direction. However, it may also be possible that the word lines, the memory gate lines, and the source lines extend in the row direction, while the bit lines extend in the column direction. It may also be possible that the source region and the drain region are not shared between the adjacent memory cells.

Also, each of Embodiments 1 to 4 has described the example which uses, as the semiconductor device, the FinFET in which the gate electrode portion GU disposed in the upper part thereof is also used to form a depletion layer, as shown in FIG. 21B, but the semiconductor device is not limited thereto. It may also be possible to use a FET having a double-gate gate electrode which is obtained by, e.g., thickening the gate insulating film GIU in FIG. 21B and in which the gate electrode portion GU does not contribute to the formation of a depletion layer. Such a double-gate gate electrode is a type of the opposed-gate gate electrode described above.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:
1. A semiconductor device, comprising:
a first semiconductor region;
a plurality of memory cells, each formed in the first semiconductor region and having a split-gate structure including an opposed-gate selection gate electrode, a memory gate electrode, and a pair of terminals; and
a first driver circuit which supplies a selection voltage to the selection gate electrode of a selected one of the memory cells and supplies a non-selection voltage to the selection gate electrode of a non-selected one of the memory cells,
wherein the first driver circuit supplies, as the non-selection voltage, a voltage which is negative or positive relative to a potential in the first semiconductor region so as to bring a selection transistor corresponding to the selection gate electrode of the non-selected memory cell into an OFF state, and further comprising:
a threshold voltage determination circuit which determines a threshold voltage of the selection transistor corresponding to the selection gate electrode of each of the memory cells, wherein the first driver circuit supplies, as the non-selection voltage, a voltage based on the threshold voltage determined by the threshold voltage determination circuit to the selection gate electrode of the non-selected memory cell.

2. The semiconductor device according to claim 1,
wherein the memory cells are arranged in the form of a matrix in the first semiconductor region,
wherein one of the pair of terminals of each of the memory cells disposed in a row of the matrix is coupled to a bit line disposed in the same row and the selection gate electrode of each of the memory cells disposed in a column of the matrix is coupled to a word line disposed in the same column, while the memory gate electrode of each of the memory cells disposed in the column is coupled to a memory gate line disposed in the same column and the other of the pair of terminals of each of the memory cells disposed in the column is coupled to a source line, and
wherein the first driver circuit supplies the non-selection voltage to the selection gate electrode of the non-selected memory cell via the word line.

3. The semiconductor device according to claim 2,
wherein the semiconductor device includes a second semiconductor region electrically isolated from the first semiconductor region, and
wherein the first driver circuit is disposed in the second semiconductor region.

4. The semiconductor device according to claim 2,
wherein the threshold voltage determination circuit includes:
a determination memory cell having a split-gate structure including an opposed-gate selection gate electrode, a memory gate electrode, and a pair of terminals; and
a determination circuit which determines the threshold voltage of the selection transistor on the basis of a current flowing in the determination memory cell and a voltage in the selection gate electrode.

5. The semiconductor device according to claim 4,
wherein each of a plurality of ones of the memory cells arranged in the form of the matrix is used as the determination memory cell.

6. The semiconductor device according to claim 2,
wherein the selection transistor corresponding to the selection gate electrode of each of the memory cells is an N-channel transistor, and
wherein the non-selection voltage is negative relative to the potential in the first semiconductor region.

7. The semiconductor device according to claim 2,
wherein the selection transistor corresponding to the selection gate electrode of each of the memory cells is a P-channel transistor, and
wherein the non-selection voltage is positive relative to the potential in the first semiconductor region.

8. The semiconductor device according to claim 2,
wherein the respective memory gate electrodes of the memory cells include an opposed-gate memory gate electrode.

9. The semiconductor device according to claim 8,
wherein the memory cells include an electrically rewritable nonvolatile memory cell having a split-gate structure using a FinFET.

10. A semiconductor device, comprising:
a plurality of memory cells arranged in the form of a matrix and each having a split-gate structure including an opposed-gate selection gate electrode, a memory gate electrode, and a pair of semiconductor regions functioning as a source region and a drain region;
a plurality of bit lines disposed in individual rows of the matrix on a one-to-one basis and each coupled to one of the pair of semiconductor regions of each of the memory cells disposed in the same row;
a plurality of word lines disposed in individual columns of the matrix on a one-to-one basis and each coupled to the selection gate electrode of each of the memory cells disposed in the same column;
a source line coupled to the other of the pair of semiconductor regions of each of the memory cells disposed in the same column of the matrix; and
a word line driver circuit coupled to the word lines to supply a selection voltage to a selected one of the word lines and supplies a non-selection voltage to a non-selected one of the word lines,
wherein the word line driver circuit supplies, as the non-selection voltage, a voltage which is negative or positive relative to a voltage in either one of the pair of semiconductor regions of each of the memory cells coupled to the non-selected word line so as to bring a selection transistor corresponding to the selection gate electrode of each of the memory cells coupled to the non-selected word line into an OFF state, and further comprising:
a threshold voltage determination circuit which determines a threshold voltage of the selection transistor,
wherein the word line driver circuit supplies, as the non-selection voltage, a voltage based on the threshold voltage determined by the threshold voltage determination circuit to the word line.

11. The semiconductor device according to claim 10,
wherein the memory cells are formed in a first semiconductor region, while the word line driver circuit is formed in a second semiconductor region electrically isolated from the first semiconductor region.

12. The semiconductor device according to claim 11,
wherein the threshold voltage determination circuit uses each of a plurality of ones of the memory cells arranged in the form of the matrix as a determination memory cell to determine the threshold voltage of the selection transistor corresponding to the selection gate electrode on the basis of a voltage in the selection gate electrode of the determination memory cell and a current flowing in the determination memory cell.

13. The semiconductor device according to claim 11,
wherein the memory gate electrodes include an opposed-gate memory gate electrode.

* * * * *